(12) United States Patent
Frouin et al.

(10) Patent No.: US 8,397,137 B2
(45) Date of Patent: Mar. 12, 2013

(54) METHOD OF DECODING CONTENT DATA BLOCKS, CORRESPONDING COMPUTER PROGRAM PRODUCT AND DECODING DEVICE

(75) Inventors: Laurent Frouin, Rennes (FR); Philippe Le Bars, Thorigne-Fouillard (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/443,824

(22) Filed: Apr. 10, 2012

(65) Prior Publication Data

US 2012/0260143 A1    Oct. 11, 2012

Related U.S. Application Data

(62) Division of application No. 12/180,632, filed on Jul. 28, 2008, now Pat. No. 8,176,392.

(30) Foreign Application Priority Data

Jul. 30, 2007    (FR) ...................... 07 56816

(51) Int. Cl.
 *H03M 13/00* (2006.01)
(52) U.S. Cl. ...................................... 714/774
(58) Field of Classification Search .................. 714/774
See application file for complete search history.

(56) References Cited

U.S. PATENT DOCUMENTS

| 5,365,525 | A | * | 11/1994 | Newberg et al. ............... 714/701 |
| 5,696,774 | A | * | 12/1997 | Inoue et al. ................... 714/755 |
| 5,715,262 | A | | 2/1998 | Gupta |
| 6,877,125 | B2 | | 4/2005 | Le Bars et al. |
| 6,898,251 | B2 | | 5/2005 | Le Bars et al. |
| 7,003,712 | B2 | * | 2/2006 | Martinian et al. ............ 714/761 |
| 7,190,730 | B2 | | 3/2007 | Ehrmann |
| 7,256,717 | B2 | | 8/2007 | Piret et al. |
| 7,315,262 | B2 | | 1/2008 | Walker et al. |
| 7,336,695 | B1 | * | 2/2008 | Hendershot ................... 375/132 |
| 7,392,454 | B2 | | 6/2008 | Piret et al. |
| 7,392,461 | B2 | | 6/2008 | Piret et al. |
| 7,398,456 | B2 | | 7/2008 | Piret et al. |
| 7,404,134 | B2 | | 7/2008 | Le Bars et al. |
| 7,424,070 | B2 | | 9/2008 | Le Bars et al. |
| 2003/0051201 | A1 | * | 3/2003 | Brenna ........................ 714/763 |
| 2004/0194006 | A1 | | 9/2004 | Piret et al. |
| 2005/0204268 | A1 | | 9/2005 | Piret et al. |

(Continued)

FOREIGN PATENT DOCUMENTS

| WO | 93/06671 | 4/1993 |
| WO | 93/18589 | 9/1993 |
| WO | 00/76272 A1 | 12/2000 |

*Primary Examiner* — Joseph D Torres
(74) *Attorney, Agent, or Firm* — Fitzpatrick, Cella, Harper & Scinto

(57) ABSTRACT

When decoding a set of symbols to be decoded, several data blocks representative of the set of symbols to be decoded are received by a decoding node of a communications network. The data blocks are encoded using an error correction code enabling a decoding by erasure. The decoding node performs the following steps: first selecting at least one of the data blocks, first determining first erasures, and checking whether the number of the first erasures is below a given threshold. In a case the check is positive, the decoding node performs first decoding by erasure of the set of symbols to be decoded. In a case the check is negative, the decoding node performs second selecting of at least one of the data blocks, second determining second erasures, and second decoding by erasure of the set of symbols to be decoded from the second erasures.

4 Claims, 11 Drawing Sheets

U.S. PATENT DOCUMENTS

| | | |
|---|---|---|
| 2005/0210357 A1 | 9/2005 | Piret et al. |
| 2006/0153155 A1 | 7/2006 | Jacobsen et al. |
| 2007/0030986 A1 | 2/2007 | McArthur et al. |
| 2008/0270873 A1 | 10/2008 | Piret et al. |
| 2009/0106624 A1 * | 4/2009 | Kondo et al. ........... 714/755 |
| 2009/0106630 A1 | 4/2009 | Le Bars et al. |

* cited by examiner

METHOD OF DECODING CONTENT DATA BLOCKS, CORRESPONDING COMPUTER PROGRAM PRODUCT AND DECODING DEVICE

This application is a division of U.S. application Ser. No. 12/180,632, filed Jul. 28, 2008 (allowed), the contents of which are incorporated herein by reference.

1. FIELD OF THE DISCLOSURE

The field of the invention is that of the transmission of data contents in a communications network.

The invention relates especially to the transmission of data contents in a synchronous wireless home communications network comprising a plurality of decoding nodes and more particularly to the transmission of contents in a 60 GHz radio transmission system.

2. BACKGROUND OF THE DISCLOSURE

60 GHz transmission systems are particularly well suited to the transmission of data at high bit rates on short distances. For example, a transmission system of this kind is well suited to connectivity between different elements of a home cinema. Indeed, in this case of use, the range of transmission is limited to about ten meters but the bit rates brought into play are very high, sometimes more than one gigabit per second owing to the nature (both video and audio) of the high resolution of the information transmitted.

Transmission systems of this kind require perfect synchronization between the transmitters and the receivers, especially in a system for broadcasting an audio content with multiple channels, comprising up to ten (or more) speakers known as a "surround sound system".

Indeed, in this specific case, a transmitter (comprising also an audio decoder) transmits in a perfectly synchronous way on different audio channels coming from a single source to a set of receivers, each comprising one speaker and all these receivers have to restore the sound totally with perfect synchronization in order to give the sound an effect of spatialization.

Given the random behavior of the transmission channel of such transmission systems (which in particular are highly sensitive to the shadowing caused for example by an individual going through the field of transmission), it is necessary to make multiple transmissions of data in order to ensure efficient reception of this data beyond a predefined residual error rate.

Error correction techniques are conventionally implemented in the digital data-processing systems of the different devices (transmitters and/or receivers) of the transmission systems to optimize the use of the transmission channel (i.e. to obtain a maximum capacity of transport of the transmission channel) but also to increase the reliability of the data received.

For example, first classic error correction techniques are MIMO ("Multiple-Input Multiple-Output") techniques relying on spatial diversity. In particular, these MIMO type error correction techniques use multiple transmission and reception of same data symbols to improve the estimation of these data symbols at reception.

MIMO type techniques rely on good a priori knowledge of the characteristics of the transmission channel despite its random behavior which varies in the course of time, the correlation between the data symbols transmitted several times and those received several times relying on this a priori knowledge of the transmission channel.

Consequently, one drawback of these first MIMO error correction techniques is that they are not suited to remaining efficient during the occurrence of an unexpected modification (modification outside the framework of the characteristics of the transmission channel defined a priori) of the transmission conditions (for example the appearance of an obstacle on the transmission path causing a shadowing on the transmission path) in the communications network.

Furthermore, another drawback of these first techniques is that they rely on the reduction of the error rate in the data symbols received rather then the correction of errors within these same symbols.

Second prior art error correction techniques analyze the quality of a received signal (for example through the measurement of the signal-to-noise ratio or SNR) to select the received piece of data having the best reception quality before decoding it.

Again, one drawback of these second error correction techniques relies on the fact that it cannot be used to pursue an efficient error correction process when there is an unexpected deterioration (caused for example by the appearance of an obstacle on the transmission path causing a shadowing on the transmission path) of the conditions of transmission in the network.

3. AIMS OF THE DISCLOSURE

The invention, in at least one embodiment, is aimed especially at overcoming these drawbacks of the prior art.

More specifically, it is an aim of the invention, in at least one of his embodiments, in the context of the broadcasting of a data content in a communications network comprising several decoding nodes which decode the content, to provide an error correction technique that remains efficient during the occurrence of unexpected deterioration in the transmission conditions of the network.

It is another aim of the invention, in at least one of its embodiments, to provide an error correction technique of this kind enabling error correction with low consumption of resources and energy.

It is another aim of the invention, in at least one of its embodiments, to provide an error correction technique such as this that can be used to optimize the efficiency of the transmission channel of the communications network.

It is another aim of the invention, in at least one of its embodiments, to provide an error correction technique of this kind that can be used to control the data-processing time independently of an unexpected variation of the transmission conditions of the communications network.

The invention, in at least one of its embodiments, is also aimed at implementing a technique of this kind that can be applied in a simple way and at low cost.

4. SUMMARY

In one particular embodiment of the invention, a method is proposed for decoding a set of symbols to be decoded, said set of symbols to be decoded being extracted from a data content, several data blocks representing said set of symbols to be decoded being received by a decoding node of a communications network comprising a plurality of nodes in the context of the broadcasting, via the network, of the data content by a sender node to at least said decoding node, said data blocks being encoded by an error correction code enabling a decoding by erasure. The decoding node performs the following steps:
- a first selecting step of selecting at least one of said data blocks, the block or blocks selected during the first selecting step being associated with a first level of priority;
- a first determining step of determining first erasures from the data block or blocks selected during the first selecting step;
- a checking step of checking whether the number of the first erasures is below a given threshold, the given threshold being function of the error correction code;
- in the event of a positive result of the checking step, a first decoding step of decoding by erasure of said set of symbols to be decoded, from said first erasures;
- else, the decoding node performs the following steps:
  - a second selecting step of selecting at least one of said data blocks, the block or blocks selected during the second selecting step being associated with a second level of priority;
  - a second determining step of determining second erasures from data blocks selected during first and second selecting steps and,
  - a second decoding step of decoding by erasure said set of symbols to be decoded, from said second erasures.

The general principle of the invention consists, in the context of the broadcasting of a content in a communications network preliminarily encoded by means of an error correction code enabling a decoding by erasure, of the implementing of a first determining of erasures from data blocks corresponding to a same set of symbols, the data blocks being selected according to a first level of priority and, in the case of a determined number of erasures below a given threshold, the decoding of the set of symbols from determined erasures. If not, a second determining of erasures is implemented from data blocks corresponding to the same set of symbols, the data blocks being selected according to a second level of priority.

Thus, the decoding by erasure of data blocks simultaneously addresses the correction of errors related, firstly, to the reliability of the transmission channel and, secondly, to the unexpected variations in the transmission conditions (for example of the shadowing type).

Thus, when the conditions of broadcasting of the content in the communications network are ideal (for example with an absence of shadowing), the invention enables the activation of a first determining of erasures from a set of data blocks supposed to rapidly lead to full decoding in order to retrieve all the initially sent symbols. Thus, in this case, the error correction is essentially accomplished by means of a decoding, performed from a first determining of errors, that is simple and costs little in terms of resources and energy. This minimizes the processing time and hence the consumption of resources and energy by the decoding node.

In the case of a determined number of erasures that is greater than the given threshold, the second decoding is performed on the basis of a second determining of erasures made on the basis of the data blocks selected during the second selection. This second determining of erasures, which is costlier, makes it possible however to overcome the defects of the first determining of erasures in the case of variations in transmission conditions (for example a shadowing) and thus nevertheless arrive at the decoding of the set of symbols extracted from the content.

Here below, the term "first-level decoding" (or incremental decoding) can be applied to the decoding by erasure performed on the basis of the erasures obtained following the first determining of erasures and the term "second-level decoding" (or final decoding) can be applied to the decoding by erasure done on the basis of the erasures obtained following the second determining of erasures.

Advantageously, the second determining step of determining second erasures is implemented after the obtaining, by the decoding node, of a piece of information called activating information, indicating that the data blocks representing the set of symbols to be decoded have all been transmitted in the communications network.

Thus, the second determining of erasures is done only when all the data blocks that could constitute the second selection of data blocks enabling the decoding of the set of symbols extracted from the content have been transmitted (and received by the decoding node if no shadowing has taken place) in the communications network.

Advantageously, the activation information is obtained from a piece of information representing a transmission sequence in the data block communications network during a clocking cycle of the communications network, each of said data blocks representing a set of symbols extracted from a data content broadcast in the communications network.

Thus, from a representation of the transmission sequence in the data block communications network during a clocking cycle of the communications network, each of the data blocks representing a set of symbols extracted from a data content broadcast in the communications network, it is possible to determine the instant at which the totality of the data blocks representing a same set of symbols extracted from a content has been transmitted in the communications network.

According to an advantageous characteristic, the transmission sequence defines, for each set of symbols extracted from a content, at least four data blocks representing said set of symbols extracted from a content.

Thus, this provides for the success, with high probability, of the decoding of the set of symbols extracted from a content in the context of decoding by two-by-two comparison of the selected data blocks whereas a shadowing has appeared during the transmission of the data blocks of the first selection.

Advantageously, for a set of symbols extracted from a content, the first three data blocks, taken in the sequence of transmission, representing said set of symbols extracted from a content are associated with the first level of priority and all the data blocks representing said set of symbols extracted from a content are associated with the second level of priority.

Thus, it is possible to carry out a first determining of erasures from three data blocks representing a same set of symbols extracted from a content, in making for example a two-by-two comparison of the symbols, and to carry out a second determining of erasures from the four data blocks should the number of erasures determined by the first determining of erasures be greater than the given threshold. This therefore provides, with high probability, for the first determining of erasures to be sufficient for the success of the decoding when there is no shadowing during the transmission of the data blocks of the first selection.

Advantageously, the method comprises a preliminary determining step of determining the sequence of transmission of the data blocks as a function of a topology of the communications network.

For example, this topology, illustrated by a reception graph, takes account of at least one obstacle to communication between two nodes, in the communications network, thus making it possible to have a synchronous bandwidth distribution matrix describing retransmissions of data blocks for decoding nodes, preventing permanent shadowing.

According to a preferred characteristic, each data block being formed by a plurality of symbols of determined identical size, the first decoding step being done from several data blocks selected during the first selecting step, the first determining step of determining first erasures comprises a sub-step of two-by-two comparison of the data of the symbols of data blocks, the compared symbols having an identical position in each of said data blocks.

Thus, preferably, in the context of the determining of the erasures, a two-by-two comparison is made of the symbols of the selected data blocks and an erasure is determined at a position when the symbols of this same position in the selected data blocks all differ two by two.

Advantageously, the error correction code is a code of a Reed Solomon type having a number of parity symbols, and the given threshold is equal to the number of parity symbols of said error correction code.

Thus, the decoding by erasure jointly uses the multiple transmissions of a data block and the Reed Solomon type redundancy information associated with this data block (as presented with reference to FIG. 2 described here below), making it possible to reduce the number of symbols representing this redundancy information, without affecting the decoding capacity. Thus, the efficiency of the code is improved and therefore the use of the synchronous bandwidth to permit, for example, up to two additional data blocks per row of a synchronous bandwidth distribution matrix (as illustrated here below with reference to FIG. 5).

Advantageously, a node, called a relay node, from amongst the plurality of nodes of the communications network being in charge of re-transmitting at least one received data block representing the set of symbols to be decoded, the method furthermore comprises a detecting step of detecting at least one padding data block, said padding data block being transmitted by the relay node in the network instead of at least one of said data blocks which is missing, a data block being missing if it has not been received by the relay node, and the padding data block is excluded from the first and second selections.

Thus, should the padding data block or blocks be purged by the decoding node, this enables the padding data blocks to be excluded from the selection made by the first and second selection means.

According to an advantageous characteristic, the second decoding step of decoding by erasure of said set of symbols to be decoded from the second erasures is interrupted following the detection of at least one predetermined event.

Thus, processing resources are preserved should it prove to be unnecessary to continue with the decoding, the data to be decoded being no longer exploitable.

According to an advantageous characteristic, during a clocking cycle of the communications network, the nodes of the network access the network according to a predetermined ordering, and the predetermined event is an end of a clocking cycle of the communications network.

Thus, the interruption of the decoding performed on the basis of the second erasures makes it possible to maintain a perfect synchronization of a content broadcast in the network by a sender node so that the decoding nodes restitute the content in a synchronized way. Thus, if the content is a sound content, then spatialization effects can be implemented during the restitution of the content.

According to a preferred characteristic, the set of symbols to be decoded corresponds to an aggregation of samples generated by an application, which is a generator of the content, during a clocking cycle of the network.

Thus, the decoding method is performed at the same clock rate as the one at which the content-generating application generates samples, sets of symbols, extracts of the content and decoding objects.

The invention also relates to a computer program product downloadable from a communications network and/or recorded on a computer-readable carrier, comprising program code instructions for the implementation of the decoding method as described here above.

The invention also relates to a totally or partially detachable computer-readable storage means storing a set of instructions executable by said computer to implement the decoding method as described here above.

The invention also pertains to a decoding node enabling the decoding of a set of symbols, called a set of symbols to be decoded, for decoding a set of symbols, called a set of symbols to be decoded, extracted from a data content, several blocks of data representing said set of symbols to be decoded being received by said decoding node, in the context of the broadcasting, via a communications network comprising a plurality of nodes, of the data content by a sender node to at least said decoding node, said data blocks being encoded by means of an error correction code enabling a decoding by erasure. Such a decoding node comprises:
 first means for selecting, for selecting at least one of said data blocks, the block or blocks selected by the first means for selecting being associated with a first level of priority;
 first means for erasure-determining, for determining first erasures from data block or blocks selected by said first means for selecting;
 means for checking, for checking whether the number of the first erasures is below a given threshold, the given threshold being a function of the error correction code;
 first means for decoding, for decoding by erasure of said set of symbols to be decoded, from first erasures, said first means for decoding being activated if said first erasures are smaller in number than said given threshold;
 second means for selecting, for selecting at least one of said data blocks, the block or blocks selected by the second means for selecting being associated with a second level of priority;
 second means for erasure-determining, for determining second erasures from data blocks selected by the first and second means for selecting; and
 second means for decoding, for decoding by erasure of said set of symbols to be decoded from the second erasures.
 said second means for selecting, said first means for erasure-determining and said second means for erasure-determining being activated if the number of said first erasures is not below said given threshold.

Another embodiment proposes a method of decoding a data block received by a receiver node in a communication network comprising a plurality of nodes wherein a sender node broadcasts data to a plurality of nodes in the network and the receiver node receives same data directly from the sender node and via at least one node other than the sender node, the data block being encoded using an error correction code which can correct an erasure, wherein the method comprising:
 an obtaining step of obtaining a data block directly received from the sender node and at least one corresponding data block received via a node other than the sender node;
 a determining step of determining an erasure symbol in the data block directly received from the sender node;

a replacing step of replacing the erasure symbol by a value of a corresponding symbol corresponding to the erasure symbol in the corresponding data block if the corresponding symbol is not an erasure symbol; and a correction step of correcting the erasure symbol, which could not be replaced in the replacing step, using the error correction code.

Advantageously, a plurality of corresponding data blocks are obtained in the obtaining step; and the erasure symbol is replaced by the value of the corresponding symbol in the replacing step if the value is common to at least two corresponding symbols.

Another embodiment proposes a program stored in a computer readable storage medium comprising a program code for implementing the aforesaid method.

Another embodiment proposes a node for decoding a data block received from a sender node in a communication network comprising a plurality of nodes wherein the sender node broadcasts data to a plurality of nodes in the network and each node receives same data directly from the sender node and via at least one node other than the sender node, the data block being encoded using an error correction code which can correct an erasure. The node comprises:

an obtaining unit adapted to obtain a data block directly received from the sender node and at least one corresponding data block received via a node other than the sender node;

a determining unit adapted to determine an erasure symbol in the data block directly received from the sender node;

a determining unit adapted to replace the erasure symbol by a value of a corresponding symbol corresponding to the erasure symbol in the corresponding data block if the corresponding symbol is not an erasure symbol; and a correction unit adapted to correct the erasure symbol, which could not be replaced in the replacing step, using the error correction node.

5. BRIEF DESCRIPTION OF THE DRAWINGS

Other features and advantages of the invention shall appear more clearly from the following description of a particular embodiment, given by way of a simple illustrative and non-exhaustive example, and from the appended drawings, of which:

Figure 10:
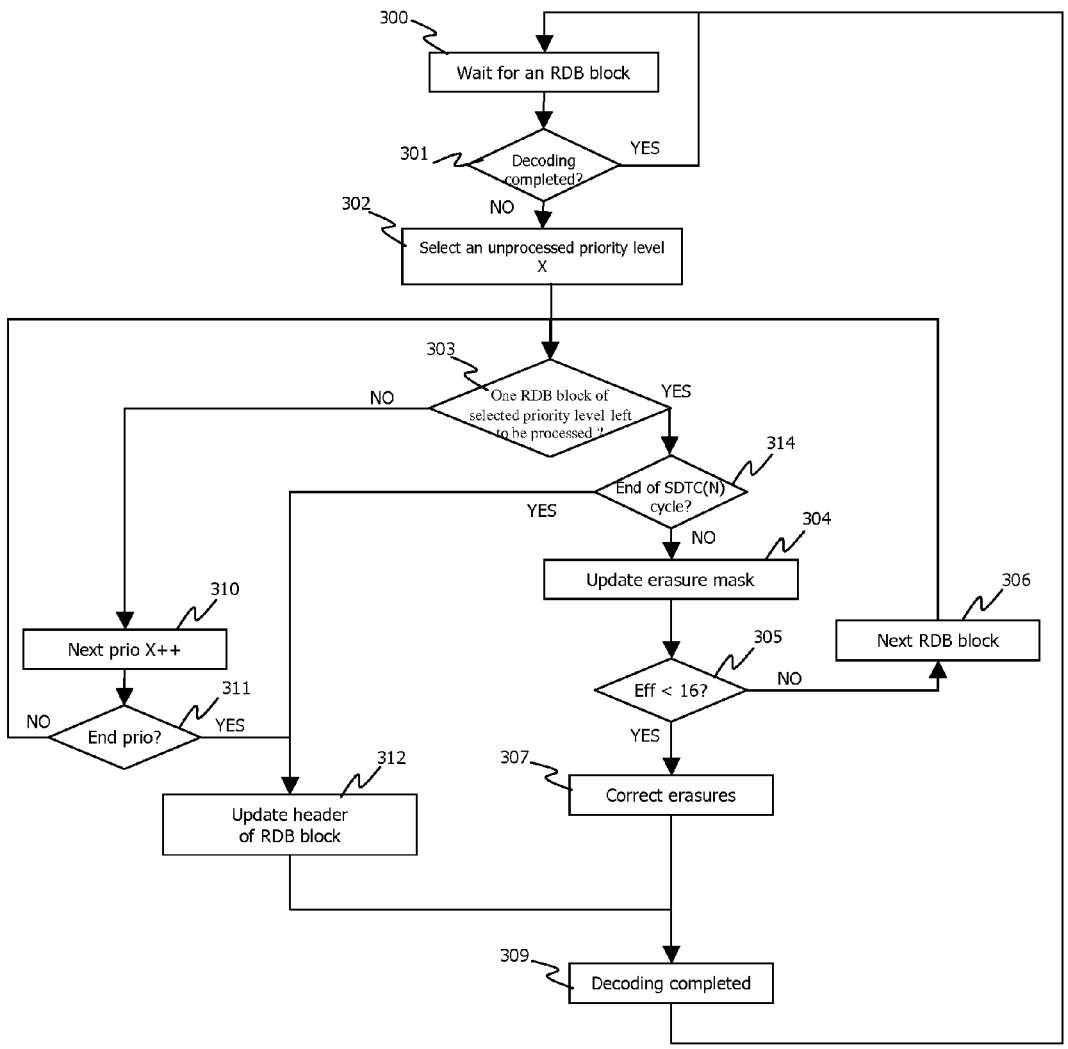
Figure 11:
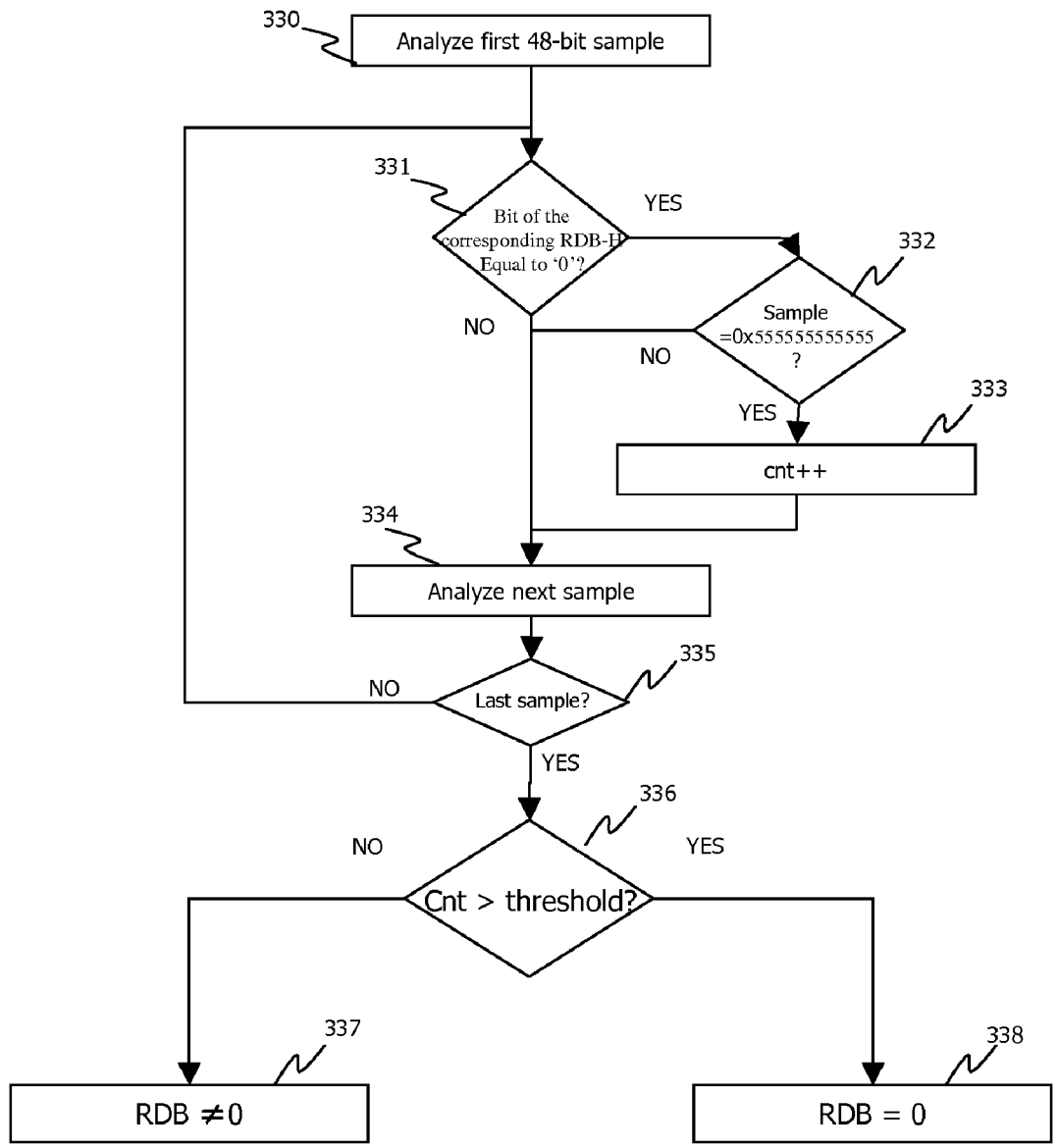

FIG. 10 gives a detailed view of the main steps of the final (second-level) decoding algorithm implemented by the decoding module of a synchronous communications module according to the particular embodiment of the invention;

FIG. 11 shows the main steps of the algorithm for the detection of a zero RDB block (also known as a missing RDB block) according to a particular embodiment of the invention;

6. DETAILED DESCRIPTION OF ILLUSTRATIVE EMBODIMENTS

Figure 1:
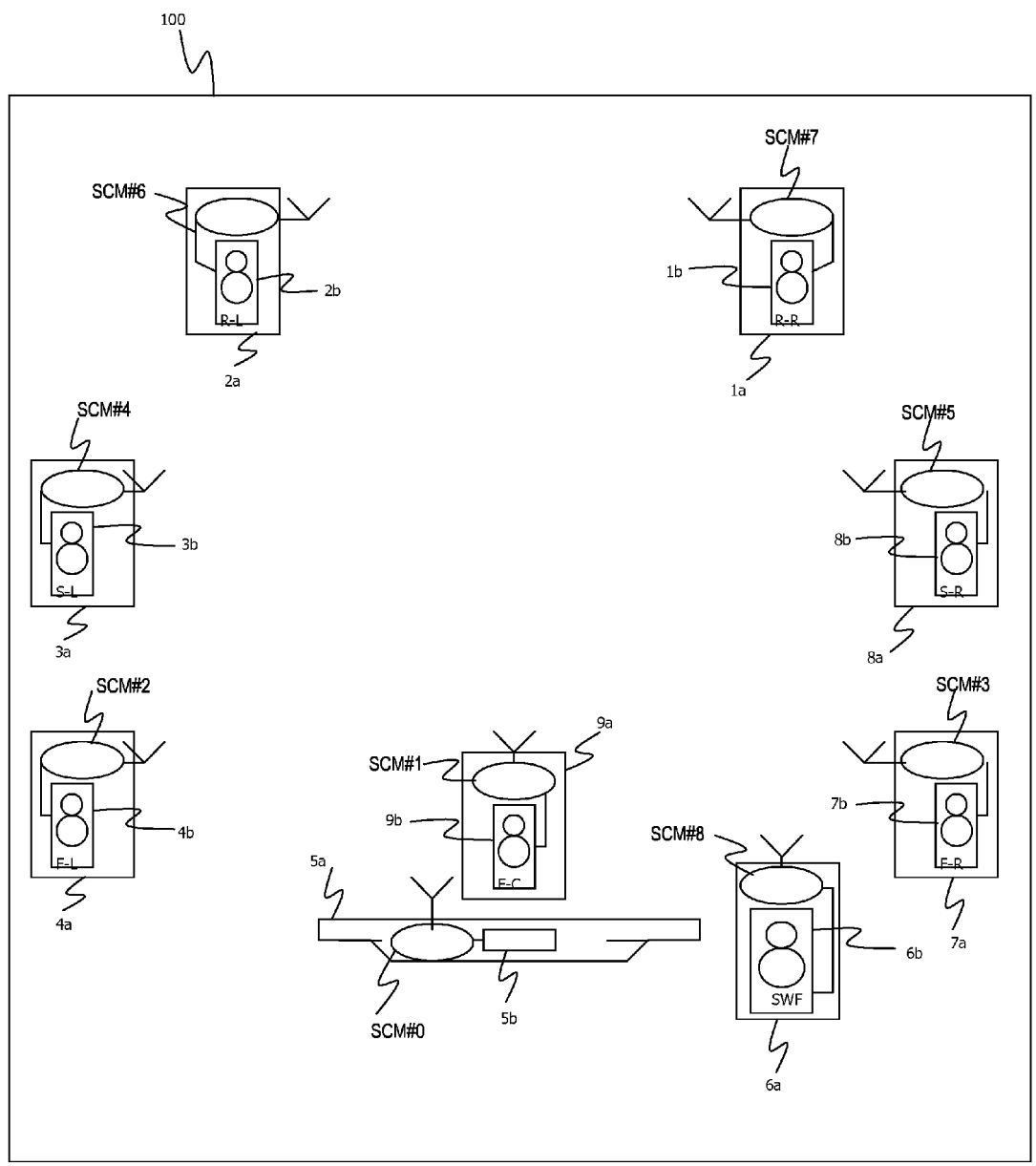
FIG. 1 is the drawing of a communications network in which it is possible to implement a decoding method according to a particular embodiment compliant with the invention.

The description of a particular application of the decoding method according to a particular embodiment of the invention is situated here below in the context of a communications network 100 which is a 7.1 type home cinema network as illustrated in FIG. 1.

Naturally, the invention can also be applied in the context of a 5.1 type home cinema or even in any other communications network.

For example, the home cinema network 100 comprises:

A WAD ("Wireless Audio Decoder") node referenced 5a which is for example a flat-screen television set. The WAD 5a comprises a multiple-channel audio decoder or "surround sound decoder") referenced 5b. The decoder 5b is capable of broadcasting on the different audio channels associated with the audio-video content displayed on the flat screen in a way that is perfectly synchronized in the communications network 100. Preferably, the WAD node 5a also comprises an audio-video source terminal (for example in DVD player not shown);

Eight WAR (Wireless Audio Renderer) nodes referenced 1a, 2a, 3a, 4a, 6a, 7a, 8a, and 9a. Each of the WAR nodes is fitted out with digital audio channel restitution means or digital audio channel amplifier means) respectively referenced 1b, 2b, 3b, 4b, 6b, 7b, 8b, and 9b. These restitution means incorporate especially a speaker.

Furthermore, each of the WAD and WAR integrates a synchronous communications module hereinafter called an SCM ("Synchronous Communication Module") module which shall be described further below in the description with reference to FIG. 4.

In the home cinema network 100, the WAR nodes and the WAD node communicate by means of a 60 GHz wireless meshed network.

The function of a WAR node therefore is to set up an interface between the speaker with which it is associated and the WAD node 5a in the wireless meshed network.

The WAR nodes and the WAD node 5a are each powered by means of a current connector (not illustrated). Each of the nodes has one or more antennas in order to implement 60 GHz wireless communications patents. This antenna is preferably an electronically controlled electromagnetic antenna.

Advantageously, each of the WAD and WAR nodes is capable of sending and receiving data. Thus, in the context of the network 100 of FIG. 1, it is possible to carry out N to N (N=8) type communications i.e. multipoint to multipoint type communications, from each of the nodes WAD 5a, WAR 1b, 2b, 3b, 4b, 6b, 7b, 8b, and 9b to each of the nodes WAD 5a, WAR 1b, 2b, 3b, 4b, 6b, 7b, 8b, and 9b.

The description here below is situated in the particular case of the broadcasting, in a communications network 100, of a data content c0 (from which data blocks are made) by the WAD node 5a, which is also called a sender node to the nodes WAR 1b, 2b, 3b, 4b, 6b, 7b, 8b, and 9b, also called decoding nodes.

In the context of this broadcast, the content data block decoding method of the invention (described in greater detail with reference to FIGS. 4 to 11) is implemented in the form of a software program and/or a plurality of software sub-programs (comprising a plurality of algorithms described here below) executed in several machines of the network 100, for example in each of the WAR nodes.

As illustrated here below with reference to FIG. 2, according to the particular embodiment of the invention, the bandwidth available on the transmission channel associated with the communications network 100 is subdivided into several synchronous virtual channels (VC) corresponding to time intervals, a set of virtual channels being assigned to the transmission of the content c0.

The frequency of processing of the virtual channels (example 8 KHz) as well as the size of the data samples transmitted (for example 48 bits) characterizes the useful bit rate of each virtual channel. Thus, a virtual channel has for example a constant bit rate of 384 Kbps (kilobits per second).

The full sequence comprising a sample of each of the virtual channels available in the network constitutes a complete synchronous data processing cycle or SDPC. The duration of an SDPC is equal to 125 µs in the case of a virtual channel processing frequency of 8 KHz.

For example, an audio transmission channel with a 96 KHz-24 bit resolution uses six virtual channels. In the context of the eight-way 7.1 type home cinema network 100 of the particular embodiment of the invention, this represents a total of 48 virtual channels.

Thus, the useful bit rate of the audio channel of the network 100 is equal to 18,422 Mbps (megabits per second) solely for the transfer of the audio information.

Furthermore, ten virtual channels are also allocated to the set of WAR and WAD nodes of the network. These virtual channels being reserved for the transfer of additional information (control information, protocol information, user commands etc.).

Consequently, according to the particular embodiment of the invention, the audio transmission channel consists of 58 virtual channels, representing a useful a bit rate of 22,272 Mbps.

Thus, among the virtual channels VC0 to VC47 allocated to all the nodes of the system and used by the communications module SCM#0 of the WAD node 5a to transmit the data content c0, it is specified that:

the pieces of data transferred by the virtual channels VC0 to VC5 are decoded and then processed by the synchronous communications module SCM#1 of the WAR node 9a, and correspond to the data intended for the front-centre speaker;
the pieces of data transferred by the virtual channels VC6 to VC11 are decoded and then processed by the synchronous communications module SCM#2 of the WAR node 4a, and correspond to the data intended for the front-left speaker;
the pieces of data transferred by the virtual channels VC12 to VC17 are decoded and then processed by the synchronous communications module SCM#3 of the WAR node 7a, and correspond to the data intended for the front-right speaker;
the pieces of data transferred by the virtual channels VC18 to VC23 are decoded and then processed by the synchronous communications module SCM#4 of the WAR node 3a, and correspondent to the side-left speaker; the pieces of data transferred by the virtual channels VC24 to VC29 are decoded and then processed by the synchronous communications module SCM#5 of the node 8a, and correspond to the data intended for the right-side speaker;
the pieces of data transferred by the virtual channels VC30 to VC35 are decoded and then processed by the synchronous communications module SCM#6 of the node 2a, and correspond to the data intended for the rear-left speaker;
the pieces of data transferred by the virtual channels VC36 to VC41 are decoded and then processed by the synchronous communications module SCM#7 of the node 1a, and correspond to the data intended for the rear-right speaker;
the pieces of data transferred by the virtual channels VC42 to VC47 are decoded and then processed by the synchronous communications module SCM#8 off the node 6a, and correspond to the data intended for the subwoofer.

Furthermore, the virtual channels VC48 to VC57 are used by the nodes of the network 100 to exchange additional data.

Thus, at least one virtual channel dedicated to the sending of this additional data to each of the other nodes of the network 100 is allocated to each node (WAR or WAD) of the communications network 100.

The following are allocated for example:
the virtual channels VC48 and VC49 to the WAD node 5a;
the virtual channel VC50 to the WAR node 9a;
the virtual channel VC51 to the WAR node 4a;
the virtual channel VC52 to the WAR node 7a;
the virtual channel VC53 to the WAR node 3a;
the virtual channel VC54 to the WAR node 8a;
the virtual channel VC55 to the WAR node 2a;
the virtual channel VC56 to the WAR node 1a; and
the virtual channel VC57 to the WAR node 6a.

A virtual channel container, also called a VC Chunk container is constituted by all the samples of a same virtual channel (virtual channel samples) transmitted on a set of SDPC cycles. The building of a given VC Chunk container is done during a full synchronous data transmission cycle or SDTC and the transmission of the VC chunk container considered is done, for its part, during the next STDC cycle.

Consequently, the duration of an SDTC is a multiple of the duration of an SDPC cycle and the term "STPR" or "synchronous transmission to processing ratio" is the term applied to the ratio of the duration of the synchronous data transmission cycle or SDTC to the duration of the synchronous data processing cycle or SDPC.

The STPR ratio thus defines the number of samples of a same virtual channel transmitted in a same VC Chunk.

According to the particular embodiment of the invention, the STPR ratio is equal to 16. Thus, the size of a VC chunk container is 96 bytes corresponding to the size of the sample (i.e. 48 bits) multiplied by the value of the STPR (herein equal to 16).

During an SDTC cycle, each node (WAS or WAD) sends at least one radio packet.

According to the particular embodiment compliant with the invention, during an SDTC cycle, six radio packets of identical duration are sent on the network in a predefined transmission sequence. Thus, the first two radio packets of the SDTC cycle are sent by the synchronous communications module SCM#0 of the WAD node 5*a*, and the next eight radio packets are sent by each of the synchronous communications modules of the WAR nodes, for example in the following predefined order: [SCM#1, SCM#2, SCM#3, SCM#4, SCM#5, SCM#6, SCM#7 and SCM#8].

Figure 2:
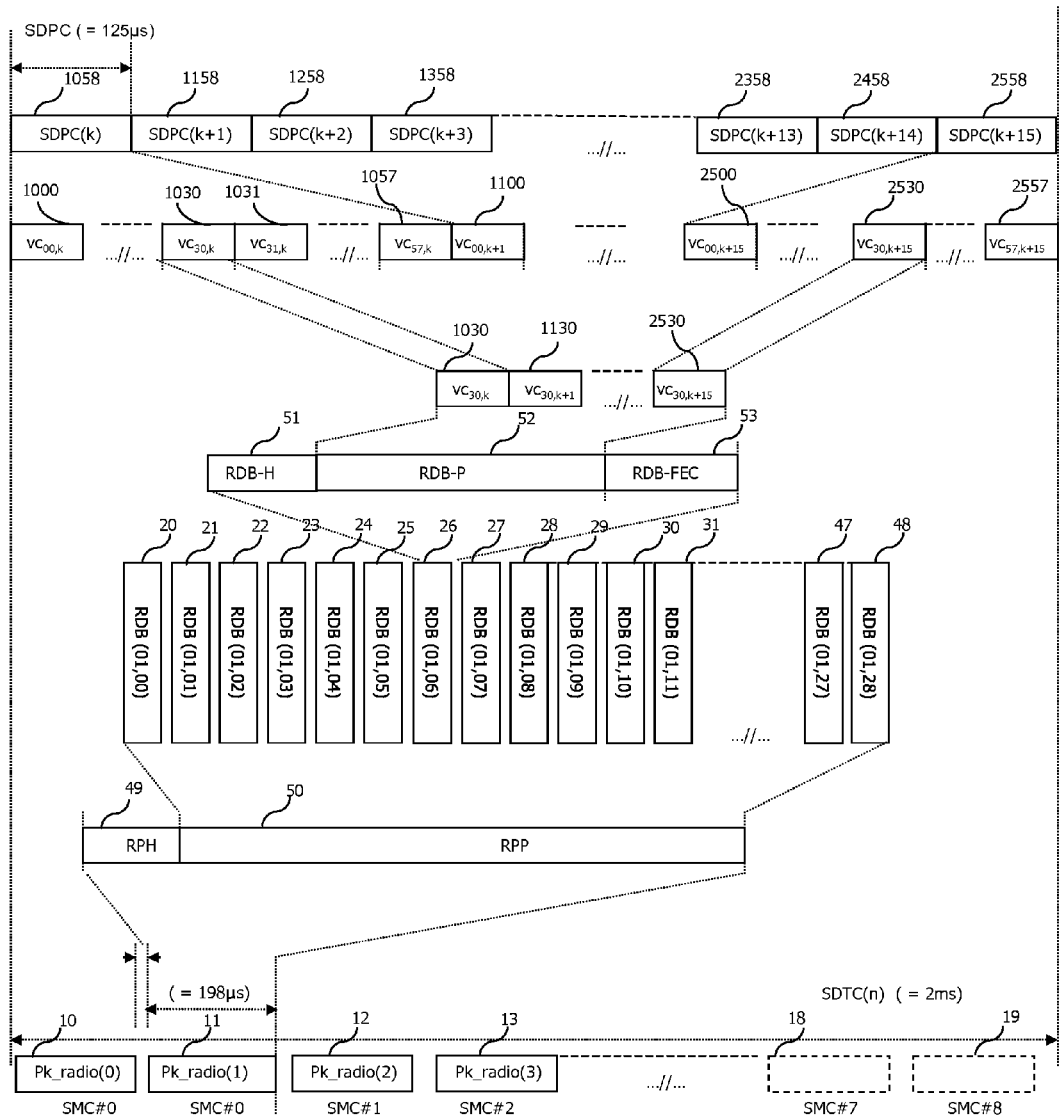
FIG. 2 illustrates the organization in data blocks of the radio packets transmitted in a synchronous data transmission cycle or SDTC, according to the particular embodiment compliant with the invention.

Referring to FIG. 2, we shall now describe the organization into data blocks of the radio packets transmitted in a synchronous data transmission cycle or SDTC.

Thus, during an SDTC (for example with a duration of 2 ms), ten radio packets (referenced 10 to 19) are sent, each of the packets being sent by the synchronous communications module SCM of a node (WAD or WAR) of the network 100.

According to the particular embodiment of the invention, the transmission time of a radio packet is slightly lower than 200 ms (for example 198 ms). This corresponds to the transmission of 3384 bytes of payload data (corresponding to a mean bit rate of 136,479 Mbps).

Naturally, variants of the embodiment of the invention may implement different values adapted to the requirements of the application and the configuration of the network desired.

During an SDTC, should the STPR be equal to 16, each synchronous communications module of the nodes (WAD and WAR) of the network processes 16 full SDPC cycles (referenced 1058 to 2558), each of the SDPC cycles having a duration equal to 125 μs. The mean bit rate of processing of the synchronous data is thus equal to 22,272 Mbps.

During each of the SDPC cycles the 58 samples of the virtual channels are processed.

Thus, for example, the samples 1000, 1030, 1031, 1057 are processed during the SDPC 1058, the sample 1100, during the SDPC 1158 and the samples 2500, 2530, 2257 during the SDPC 2558. It must be noted that, for the sake of clarity, only the above-mentioned samples are shown in FIG. 2.

A radio packet comprises:
- a header field 49, called RPH (radio packet header) comprising protocol information necessary especially for managing control of access of each node to the transmission channel; and
- a payload data field 50 denoted RPP (radio packet payload) comprising especially a set of radio data blocks or RDB and 24 bytes reserved for future extensions.

In particular, the RPP field 50 is subdivided into radio data blocks, here below called RDB (referenced 20 to 48), for example with a length of 114 bytes. As a consequence, for each radio packet, the number of RDB blocks per RPP field is equal to 29.

The format of a radio data block RDB remains identical whatever the nature of a VC Chunk container (transmitted, estimated to be retransmitted or estimated to be decoded and then processed).

A radio data block RDB comprises:
- a header field 51, denoted RDB-H (radio data block header) whose size is equal, for example, to two bytes;
- a payload data field 52, denoted as RDB-P (radio data block payload) whose size is, for example, equal to 96 bytes; and
- a piece of redundancy information 53 designed for error correction, denoted as RDB-FEC (or radio data block forward error correction) whose size is, for example, equal to 16 bytes.

Thus, the payload data field RDB-P 52 corresponds to a VC Chunk container. The data of the RDB-P field 52 are either such that they are "transmitted" if the RDB block is sent by the module SCM#0 of the WAD node 5*a* (sender node), or such that they are "estimated to be retransmitted" if the RDB block is retransmitted by an SCM module of a WAR relay node of the block, or such that they are "estimated to be decoded and then processed" if the RDB block is received by an SCM module that is a receiver and addressee of the block.

The communications network 100 is a wireless network and errors may occur during the transmission of the data.

Thus, the SCM modules of the relay or destination WAR nodes, in certain cases, have only an estimation of the payload data of the RDB block as it was initially transmitted by the WARD node 5*a*.

Thus, according to the example of the embodiment of the invention, and in compliance with the field 112 of a synchronous bandwidth distribution matrix illustrated here below with reference to FIG. 5, the synchronous communications module SCM#0 of the WAD node 5*a* sends a radio packet 11 comprising an RPP field 50. The RPP field 50 comprises especially the RDB radio data block 26 itself comprising 16 samples associated with the virtual channel VC#30 and generated by the module SCM#0 of the WAD node 5*a* during the preceding SDTC and transmitted for the first time during the current cycle.

Similarly, the same radio packet 11 comprises the RDB radio data block 48 associated with the retransmission of the 16 samples of the virtual channel 48 VC#56 transmitted during the preceding SDTC by the synchronous communications network SCM#7 of the WAR node 1*a*, in compliance with the field 119 of the synchronous bandwidth distribution matrix illustrated here below with reference to FIG. 5.

The term "data retransmission" is understood to mean the transmission, by a node of the network, of data that it has previously received from another node of the network. Indeed, in order to ensure high spatial diversity in a 60 GHz radio transmission system and thus ensure that a sufficient number of copies of a sample of content (or data blocks representing a same sample of content) reaches the intended recipient of the content sample, certain nodes will relay (or retransmit) the data initially sent out by other nodes of the communications network. The retransmissions are done according to the description carried in the synchronous bandwidth distribution matrix, described here below with reference to FIG. 5.

Figure 3:
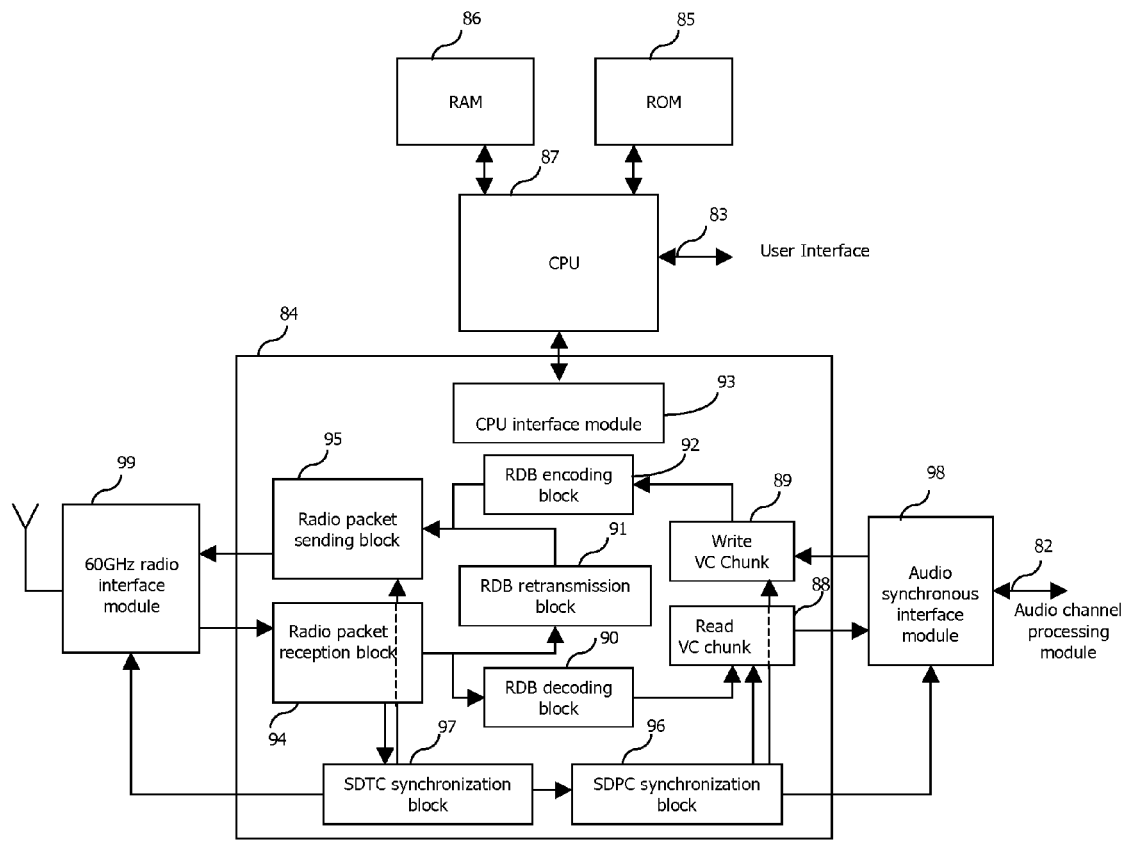
FIG. 3 shows an example of a detailed architecture of a generic synchronous communications module or SCM of a WAR or WAD node of a communications network according to the particular embodiment of the invention.

Referring to FIG. 3, a detailed description is provided of an example of the architecture of a generic synchronous communication module or SCM of a WAR or WAD node of the communications network 100 according to the particular embodiment of the invention.

Thus, a generic synchronous communications module of a WAR or WAD node comprises:
- a RAM (random access memory) execution memory block 86;
- a read-only memory block 85 in which different static representations of synchronous bandwidth distribution matrices (illustrated here below with reference to FIG. 5) are for example stored;
- a user interface 83;
- a processing unit 87, also called a CPU (or central processing unit). The execution memory block 86 and the non-volatile or read-only memory block 85 are directly associated with the CPU 87. Furthermore, the CPU 87 can process configuration information (for example the layout and dimensions of the room in which the home cinema network 100 is set up, zones of passage, etc) in order to choose the most appropriate synchronous bandwidth distribution matrix;

module for the processing of the audio channels 82 which may be either a digital audio channel amplifier or a multi-channel audio decoder also known as a surround sound decoder;

a 60 GHz radio interface module 99;

an audio synchronous interface module 98;

a communications module 84 which communicates with the CPU 87.

Furthermore, the communications module 84 provides for the transfer of data between the 60 GHz radio interface module 99 and the audio synchronous interface module 98 to and/or from the audio channels processing module 82.

Furthermore, according to the particular embodiment compliant with the invention, the communications module 84 of the generic synchronous communications module or SCM comprises especially:

an interface module or CPU 93 through which the CPU 87 communicates with the communications module 84. The interface module or CPU 93 manages especially interruptions sent to the CPU 87 as well as data exchanges (not shown in order not to burden the figure) between the different blocks of the communications module 84 (described in detail here below) and the CPU 87. Furthermore, during the initialization of the network 100, the interface module CPU 93 stores the synchronous bandwidth distribution module used by the network 100.

a reading block 88 for reading VC chunk containers. The reading block 88 is responsible for the extraction, during the synchronous data processing cycle of SDPC, of each sample extracted from the RDB-P field 52 of a RDB radio block received as a function of the RDB-H field 51;

a writing block 89 for writing to VC Chunk containers. The writing block 89 is responsible for building the RDB-P 52 and RDB-H 51 data fields of each RDB radio data block associated with a virtual channel VC, as and when each of the samples of the virtual channel considered is written during the SDPC or synchronous data processing cycle, with which the sample is associated;

a radio packet sending block 95 comprising a radio packet sending memory zone. The sending block 95 incorporates especially functions of modulation (for example OFDM type functions) and of convolutional encoding (for example by polynomial division in the bit field);

a radio packet reception block 94 comprising a radio packet reception memory zone. The reception block 94 performs functions in inverse to those implemented in the sending block 95, especially demodulation and Viterbi decoding functions;

an STDC cycle synchronization block 97. The STDC cycle synchronization block 97 controls the regular sequencing of the SDTC cycles relative to the radio packets received by the reception block 94 to ensure perfectly synchronous access to the transmission channel of the sending block 95 for the sending of radio packets. Thus, according to the particular embodiment of the invention, the control mechanism thus implemented enables the processing in transmission/reception of exactly ten radio packets during an SDTC or synchronous data transmission cycle;

an SDPC cycle synchronization block 96. The SDPC cycle synchronization block 96 controls the regular sequencing of the SDPC cycles in order to ensure perfectly synchronous transfer of the samples of each virtual channel between the read blocks 88 and the write blocks 89 of the VC chunk containers and the audio synchronous interface module 98. The SDPC cycle synchronization block 96 is driven by the SDTC cycle synchronization block 97, the SDPC cycle being a division of the STDC cycle and being aligned on the STDC cycle;

an RDB radio data block encoding block 92. The encoding block 92 computes the value of the RDB-FEC field 53 as a function of the value of the RDB-P field 52 and RDB-H field 51 in applying a maximum distance separable or MDS code of a Reed Solomon (j,k) type with j=114 and k=98 (114 representing the total number of symbols (or bytes) corresponding to the RDB-P field 52, RDB-H field 51 and RDB-FEC field 53, and 98 representing the totalized number of symbols corresponding to the RDB-P field 52 and RDB-H field 51). The MDS code enables the correction of a maximum number (j-k) of erased symbols (16 according to the particular embodiment of the invention). After encoding, the RDB blocks are stored in the radio packet sending memory zone of the sending block 95 according to their referencing in the synchronous bandwidth distribution matrix stored in the interface module CPU 93. It must be noted that the generation of the RDB-H field 51 and RDB-FEC field 53 is only done by the SCM synchronous communications module at the source of the virtual channel, respectively by the write block 89 and the encoding block 92. Indeed, the SCM synchronous communications module of a WAR relay node of an RDB block does not regenerate the RDB-H field 51 and RDB-FEC field 53 of the RDB block considered and takes up only the value of these fields such as they are received by the SCM synchronous communications module;

an RDB radio data block retransmission block 91. The retransmission block 91 extracts certain of the RDB blocks stored in the radio packet reception memory zone of the reception block 94 to then store them in the radio packet sending memory zone of the sending block 95 according to their references in the synchronous bandwidth distribution matrix stored in the CPU interface module 93;

an RDB radio data block decoding block 90. The decoding block 90 for decoding synchronous RDB or radio data blocks is described in more ample detail here below with reference to FIG. 4.

The read block 88 and the write block 89 belong to the part of the communications module 84 dedicated to the processing of the synchronous data and the radio packet sending block 95 and reception block 94 belong to the part of the communications module 84 dedicated to the transmission of synchronous data.

At the initialization of the home cinema network 100, the CPU 87 carries out the transfer of a synchronous bandwidth distribution matrix from the ROM memory block 85 to the CPU interface module 93 so that it is used to organize communications on the network 100.

Optionally, the synchronous bandwidth distribution matrix used by the network 100 can be chosen from among several matrices (all stored in the ROM memory block 85) as a function of user information on the application and the environment of the network 100 communicated via the user interface 83. During an SDTC or synchronous data transmission cycle, the communications module 84 must read and write all the samples corresponding to the virtual channels to be processed during the 16 full SDPC or synchronous data processing cycles (should the STPR ratio be equal to 16).

Furthermore, before each sending of radio packets by the sending block 95, the generic synchronous communications module or SCM of the network 100 simultaneously performs the following operations:
- reception (by means of the reception block 94) then selection of a predefined number of RDB or radio data blocks (by means of the retransmission block 91); and
- determining of the set of RDB blocks associated with the VC Chunk containers of which it is the source (by means of the encoding block 92) as well as the RDB protocol information associated with them, respectively RDB-H 51 (by means of the write block 89) and RDB-FEC 53 (by means of the encoding block 92).

It must be noted that the retransmission of the radio packets is distributed between the different synchronous communication modules SCM belonging to the home cinema network 100 as a function of the number of RDB blocks available for each of the nodes of the network, according to the assignations described (or referencing operations described) in the synchronous bandwidth distribution matrix.

Figure 4:
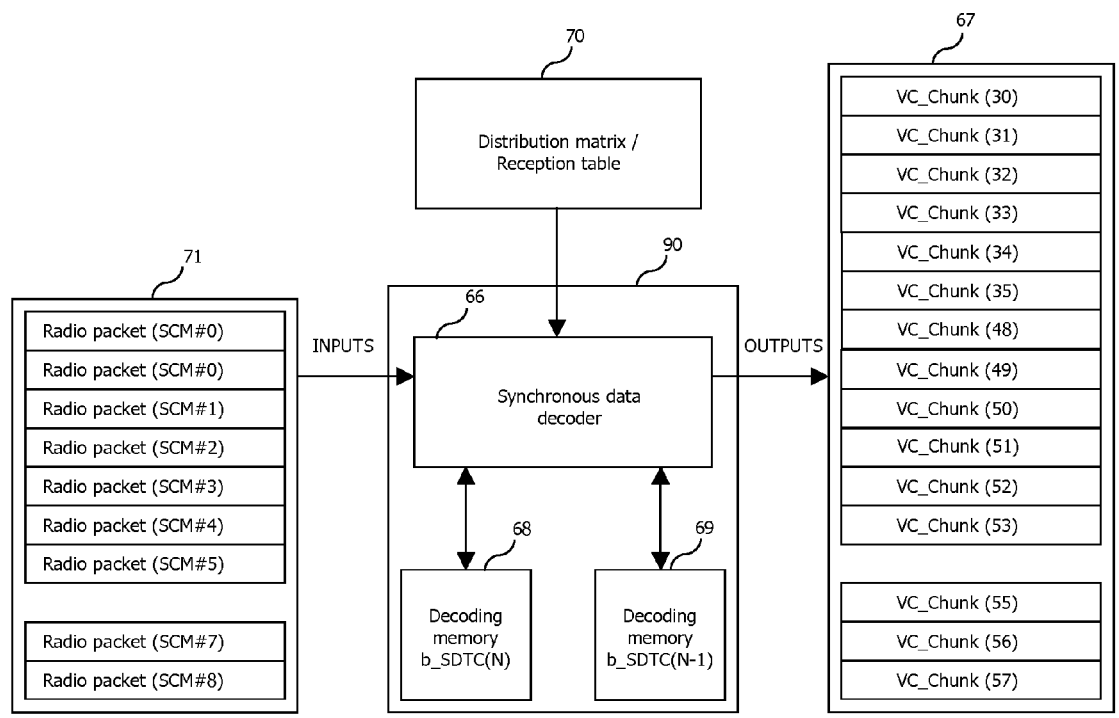
FIG. 4 shows an example of operation of the synchronous radio data decoding block RDB according to the particular embodiment compliant with the invention.

Referring to FIG. 4, a description is provided of an example of operation of the decoding block 90 for decoding synchronous RDB radio data according to the particular embodiment compliant with the invention.

As illustrated in FIG. 4, the decoding block 90 for decoding synchronous RDB radio data comprises especially:
- a module 66 for the decoding of the RDB radio data blocks received as a function of their referencing in the synchronous bandwidth distribution matrix 70 stored in the CPU interface module 93;
- a decoding buffer memory or buffer 68, also called b_SDTC(N), which stores the radio data associated with the SDTC(N) cycle. The buffer memory b_SDTC(N) 68 exchanges data with the RDB data block processing module 66;
- a decoding buffer memory 69, also denoted as b_SDTC(N−1), which stores the radio data associated with the cycle SDTC(N−1), SDTC(N−1) being the SDTC cycle preceding the SDTC(N) cycle. The buffer memory b_SDTC(N−1) 69 exchanges data with the RDB data block processing module 66.

The decoding module 66 decodes the RDB blocks coming from the reception memory zone 71 of the reception block 94. The reception memory zone 71 comprises several buffer memories which store radio packets associated with the SDTC(N) cycle.

Furthermore, the decoding module 66 transmits the decoded VC Chunks containers to a buffer memory zone 67 (also denoted as b_SDTC(N−2)) for the processing of the read block 88 of the communications module 84. The memory zone 67 has several buffer memories which store the VC Chunks containers associated with the SDTC(N−2) cycle, SDTC(N−2) being the SDTC cycle preceding the SDTC(N−1) cycle, and decoded by the decoding module 66.

During an SDTC cycle, the decoding module 66 of the decoding block 90 performs the following operations:
- a first level of decoding by erasures from a first selection of RDB radio data blocks received during the current SDTC(N) cycle and during the preceding SDTC(N−1) cycle by the reception block 94; and
- a second level of decoding by erasures, in the event of failure of the first level of decoding by erasures, from a second selection of RDB radio data blocks received during the current SDTC(N) cycle and during the preceding SDTC(N−1) cycle by the reception block 94.

The read block 88 processes the RDB radio data blocks sent (for the first time) during the SDTC(N−2) cycle and finally decoded by the decoding module 66 during the previous cycle, i.e. the SDTC (N−1) cycle.

The decoding block 90 of the communications module 84 temporarily uses the decoding buffer memory b_SDTC(N) 68 and the decoding buffer memory b_SDTC(N−1) 69 comprising the set of RDB blocks associated with a given VC chunks container as well as the intermediate value of the given VC chunks container undergoing decoding.

When the end of the SDTC(N) cycle takes place, the decoding of the RDB blocks memorized in the buffer memory b_SDTC(N−1) 69 by the decoding module 66 is completed (or has been interrupted as described here below with reference to FIG. 8). The data of the buffer memory b_SDTC(N−1) 69 then replaces that of the buffer memory b_SDTC(N−2).

Figure 5:
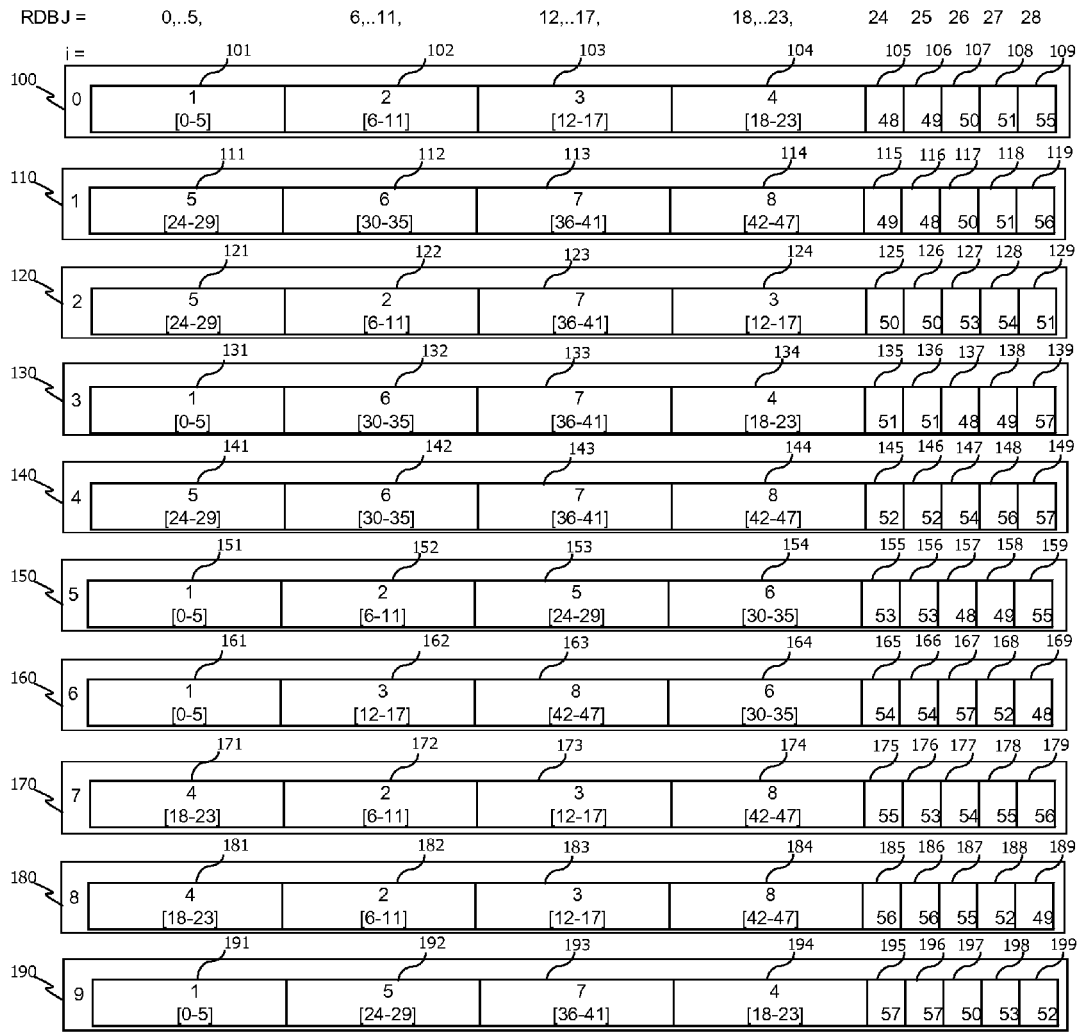
FIG. 5 shows an example of a synchronous bandwidth distribution matrix during the initializing of the communications network of FIG. 1 according to the particular embodiment of the invention.

Referring to FIG. 5, an example is presented of a synchronous bandwidth distribution matrix stored in the interface module 93 by the CPU 87 during the initialization of the communications network 100 according to the particular embodiment of the invention.

According to the particular embodiment of the invention, a synchronous data transmission cycle or SDTC is subdivided into 290 radio data blocks or RDB (10 radio packets being transmitted per SDTC cycle, each radio packet comprising 29 RDB blocks).

The rows (referenced 100, 110, 120, 130, 140, 150, 160, 170, 180, 190) of the synchronous bandwidth distribution matrix each represent the content of the RDB fields of the 10 radio packets respectively sent out by the SCM#0 modules (which is the only one to send out two consecutive packets), SCM#1, SCM#2, SCM#3, SCM#4, SCM#5, SCM#6, SCM#7, SCM#8 during the SDTC cycle.

Each row of the matrix is therefore formed by 29 elements, each representing a radio data block or RDB according to its position in the radio packets transmitted by the SCM module associated with the row of the matrix.

For the sake of clarity, as illustrated in FIG. 5, certain elements of the rows of the matrix are grouped together to form wider fields (for example the field 101) thus describing six elements of the matrix while other elements are not grouped together (for example the element 105). For example, the field 101 contains the elements that represent the six blocks RDB(0, j) for j varying from 0 to 5. The field 105 for its part contains only one element that represents the block RDB(0, 24).

Thus, according to the particular embodiment of the invention, during a SDTC(N) cycle, the different fields RDB(i,j) for $0 \leq i < 10$ and $0 \leq j < 29$ of the distribution matrix have the following meaning:
- for 58 of the RDB radio data blocks transmitted during the SDTC(N) cycle, the RDB-P payload data field 52 contains a VC chunk container transmitted for the first time on the network 100. The 58 RDB blocks considered are, for example, represented by the fields 101 to 105, 111 to 115, as well as the fields 125, 135, 145, 155, 165, 175, 185, and 195 of the distribution matrix;
- for the 232 other radio data blocks or RDB of the distribution matrix, the RDB-P payload data field 52 contains a VC chunk container which has been either preliminarily received (during a previous SDTC) then retransmitted, or comes from the same SDTC(N) cycle, or has been transmitted during one or more previous SDTC(N−m) cycle. In the particular embodiment compliant with the invention, the retransmission is limited to the preceding cycle only (i.e. to the case m=1). Thus, the fields of the matrix 131 to 134, 143, 144, 157, 158, 162, 172, 184, 192, 197, 198 and 199 represent for example 65 RDB blocks retransmitted during the same SDTC(N) cycle as that of their first transmission. The remaining fields representing the 167 remaining RDB blocks, identify retransmitted RDB blocks whose first transmission has been done during the previous SDTC(N−1) cycle.

In the particular embodiment of the invention, each RDB block is transmitted (sent or relayed) by the different modes of the network 100 on at least four (in this case five) occasions (i.e. five transmissions for a same VC chunk container), which partly characterizes the distribution of the RDB blocks within the synchronous bandwidth distribution matrix.

The fact that each RDB data block corresponding to a same VC chunk container is transmitted at least four times makes it possible especially to assign high priority to three of these transmitted RDB blocks (for example the first three transmitted) among the at least four blocks transmitted and thus makes it possible, with high probability, that the first determining of erasures is enough for the success of the decoding when there is no shadowing during the transmission of the data blocks of the first selection (i.e. the first three in the above-mentioned example). Indeed, in carrying out a 2 by 2 comparison of the symbols to determine the erasures, the probability of obtaining a number of erasures smaller than the number of parity symbols of the error correction code is high, in taking three received RDB data blocks corresponding to a same VC chunk container. The term "two by two comparison" is understood to mean the comparison of the data of the symbols of data blocks two by two, the compared symbols having an identical position in each of said data blocks; if, during this comparison, the symbols differ, then the number of erasures linked to the decoding of the data block is incremented by one unit.

However, given this constraint of five (at least four) transmissions per RDB block, there are many static representations of synchronous bandwidth distribution matrices. It is therefore possible to have several static representations of this matrix stored in the ROM 85 and to decide, when initializing the home cinema network 100 and/or upon the user's request, to choose one of them in particular (for example on the basis of information entered by the user such as the presence of permanent obstacles by means of the user interface 83).

Each element of the synchronous bandwidth distribution matrix corresponds to an RDB block and comprises especially the following information:
- a field designated as "VCB" (virtual channel bank) indicating a synchronous band number. The field VCB indicates the synchronous band number with which is associated the virtual channel VC whose container VC Chunk is transported by the RDB block considered. This synchronous band number is an application identifier, i.e. an identifier common to the virtual channels VC used to convey the data coming from the same content. In the example of the particular embodiment of the invention, a VCB number is assigned per audio channel giving a total of eight VCB numbers. A virtual channel synchronous band therefore comprises six virtual channels. All the virtual channels belonging to a same synchronous VCB band indicate a same predefined value for this VCB field. The VCB field is optional and can take an indefinite value (for example for the virtual channels VC 48 to 57 designed to convey additional synchronous data);
- a field designated as "VC" (virtual channel). The VC field indicates the virtual channel number whose VC chunk container is transported by the RDB block considered;
- a field designated as "Rx" which indicates that the node of the network receiving the VC chunk container associated with the virtual channel is an intended recipient of the data of the virtual channel (in this case Rx='1'), or that it is not an intended recipient (in this case Rx='0');
- a field designated as "SDTC" indicating that the SDTC during which the VC Chunk container transported by the RDB block considered has been transmitted for the first time. When such an SDTC cycle is the current SDTC cycle, then the SDTC field takes the value '0', and when such an SDTC cycle is the preceding SDTC cycle, then SDTC takes the value '1';
- a field designated as "retransmitted" which indicates whether the VC chunk container conveyed by the RDB block considered is retransmitted or relayed (in this case retransmitted='1') or not (in this case retransmitted='0');
- a field designated "rank" which indicates the number of RDB blocks remaining to be transmitted and corresponding to the same VC chunk container as the one conveyed by the RDB block considered. For example, the rank field takes a value 4 during the first transmission (should the VC chunk container be transmitted five times). The value of the rank field depends on the order of appearance in time of the RDB block and not on the order of appearance of the RDB block in the distribution matrix;
- a "prio" field indicating the decoding priority (preferably, for a given VC chunk container; priority decoding values in rising order from one to five, are assigned in the distribution matrix to each of the RDB blocks corresponding to a same VC chunk container as the one conveyed by the RDB block considered, in the chronological order of transmission of these blocks). The higher the priority, the lower the value of the field prio (the value "1" being assigned to the highest priority).

For example, the element of the matrix corresponding to the sixth RDB block of the first radio packet sent in an SDTC cycle (also denoted as RDB(1; 6)) is characterized by: RDB (1; 6)={VCB=6; VC=30; Rx=INDEFINI; SDTC=0; retransmitted=0; rank=4; prio=INDEFINI}.

It must be noted that the fields Rx, rank and prio are not shown in FIG. 5.

During the initialization of the home cinema network 100, each node of the network 100 loads a same synchronous bandwidth distribution matrix into its own synchronous communications module.

Referring to FIGS. 6A to 6D, a description is given of examples of a priori reception graphs of the synchronous communication modules of the nodes of the communication network according to the particular embodiment compliant with the invention.

For each node (WAS or WAD) of the network, it is possible to make an our priori identification of a predefined number of best sender nodes from an a priori reception graph, on the basis of a typical topology proper to the communications network 100.

Relative to an ideal position in space of each of the nodes of the home cinema network 100 it is possible to represent an a priori reception graph.

Figure 6A:
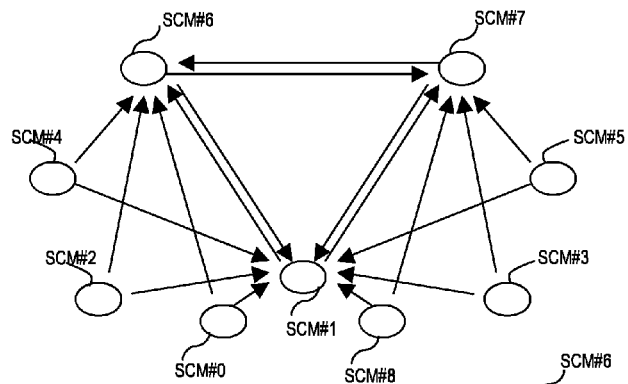
FIGS. 6A to 6D illustrate examples of an a priori reception graph of the synchronous communications modules of the nodes of the communications network according to the particular embodiment compliant with the invention.
Figure 6B:
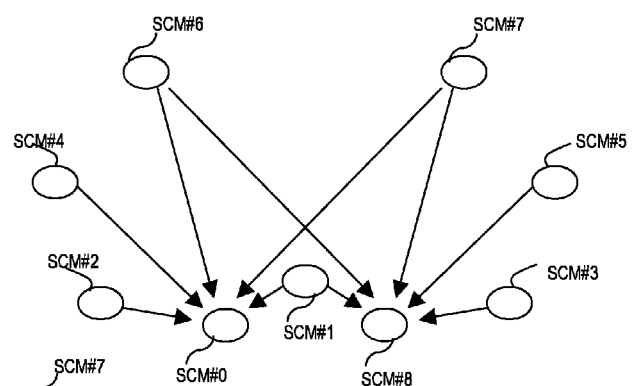
Figure 6C:
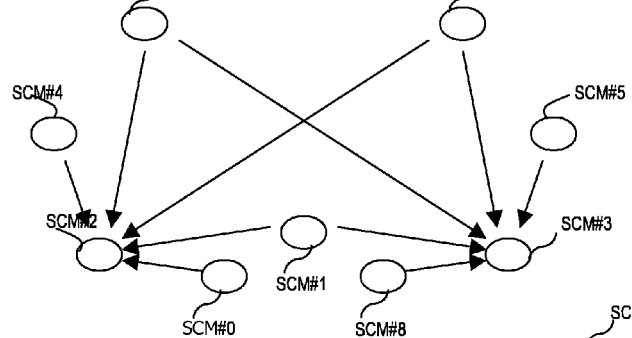
Figure 6D:
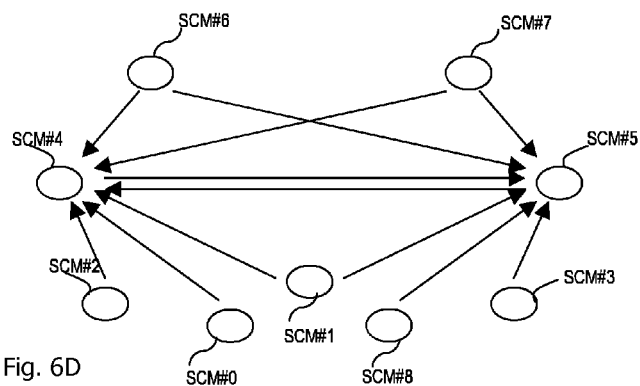

Thus, FIG. 6A (and FIG. 6B, FIG. 6C, FIG. 6D respectively) describe an example of an a priori reception graph of the synchronous communications modules SCM#1, SCM#6 and SCM#7 (SCM#0 and SCM#8 respectively for FIG. 6B, SCM#2 and SCM#3 for FIG. 6C, and SCM#4 and SCM#5 for FIG. 6D).

As illustrated in FIG. 6A, the synchronous communications module SCM#1 is supposed to receive the radio packets from all the other synchronous communication modules SCM#2, SCM#3, SCM#4, SCM#5, SCM#6, SCM#7, SCM#8 and SCM#0.

An a priori reception graph is associated with a synchronous band distribution matrix, and can be used to initialize the decoding priority associated with the elements of the distribution matrix that constitute the reception table described here below.

The reception table of a synchronous communications module is a subset of the synchronous bandwidth distribution matrix constituted by the set of fields representing RDB blocks whose transported payload information contains virtual channels intended for this synchronous communications module.

At the initialization of the home cinema network 100, each node initializes the list of the different RDB blocks associated with the transmission and retransmission of the samples of each of the virtual channels that it must decode.

Furthermore, during this initialization of the network, each node carries out an a priori determining of a set of RDB blocks to be decoded as a priority depending, for example, on the a priori reception graph of their synchronous communications module SCM. The other RDB blocks are then, if necessary, decoded later.

Furthermore, for each virtual channel, the RDB blocks transmitted for the first time (i.e. without retransmission) as well as the SDTC associated with their transmission are identified.

For example, during the initialization of the network 100, the synchronous communications module SCM#6 (for which the samples of data of the virtual channels VC30 to VC35 are intended in particular) can identify the RDB blocks associated with the fields 112, 132 and 142 as being the RDB blocks to be decoded as a priority for the reception of the VC chunk containers of the virtual channels VC30 to VC35.

Figure 7:
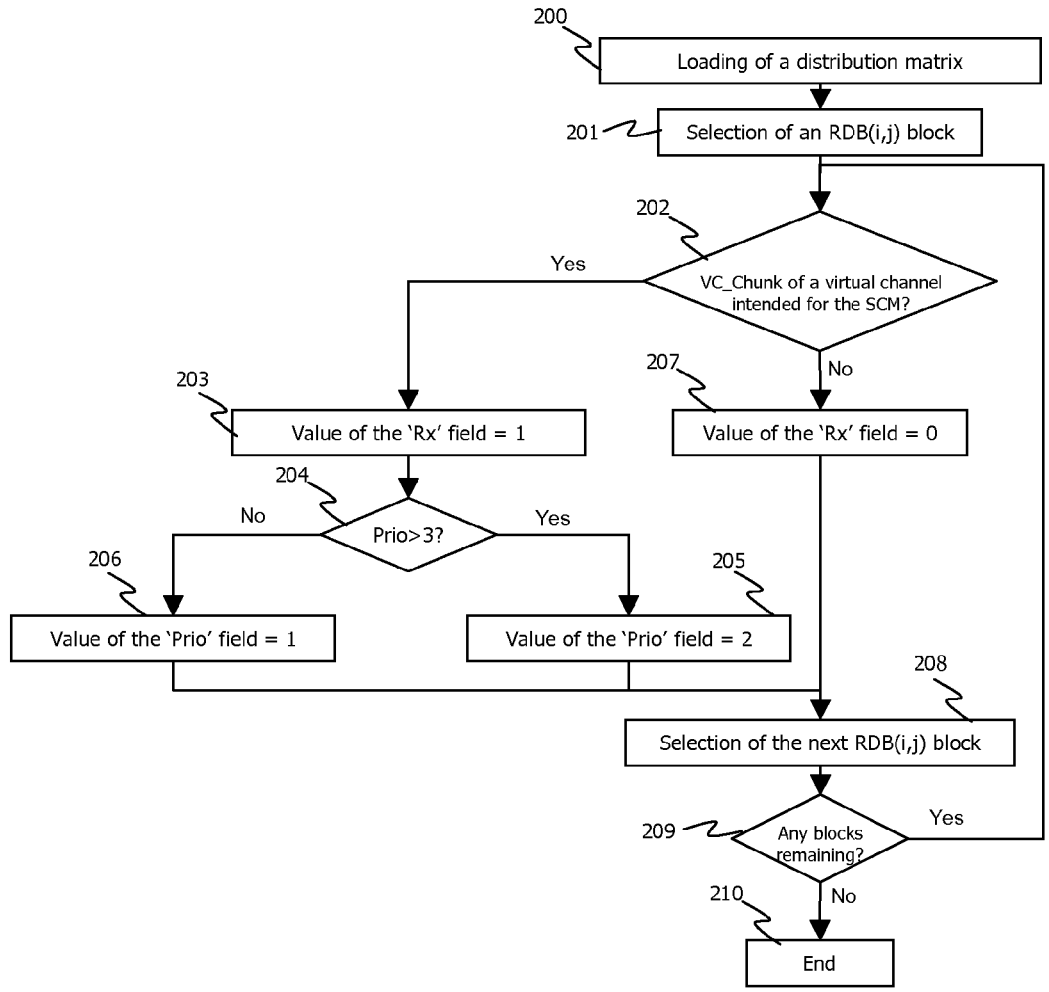
FIG. 7 shows the main steps of an algorithm for initialization and management of the reception table of the synchronous communications module, implemented within the interface module CPU presented with reference to FIG. 3 according to the particular embodiment compliant with the invention.

Referring to FIG. 7, a description is provided of the main steps of an algorithm for the initialization and management of the reception table of a synchronous communications module implemented within the interface module CPU 93 according to the particular embodiment compliant with the invention.

Optionally, in a preliminary step, a synchronous bandwidth distribution matrix is selected.

Thus, in the step 200, the CPU 87 loads the selected distribution matrix into the interface module 93 from the ROM memory block 85.

In a step 201, the interface module 93 selects an element of the loaded distribution matrix, this element representing an RDB block written as RDB(i,j) (i ranging from 0 to 9 and j from 0 to 28).

In a step 202, a check is made to see whether the block RDB(i,j) of the selected element represents a VC chunk container associated with one of the virtual channels intended for the synchronous communications module.

In the event of positive verification at the step 202 (the block RDB(i,j) has to be decoded), the value of the field Rx of the selected element takes the value 1 (i.e. Rx='1') during a step 203 (step for marking RDB blocks to be decoded).

In a step 204, a check is made to see whether the "prio" field of the selected element of the distribution matrix is strictly greater than 3.

In the event of positive verification at the step 204, the prio field of the selected element takes the value 2 (i.e. prio=2) during a step 205.

In the event of negative verification at the step 204, the field prio of the selected element takes the value 1 (i.e. prio=1) during a step 206.

Thus, during the steps 204 to 206, high priority values are assigned systematically by assigning the value '1' (high priority) to the field 'prio' to the first three RDB blocks in the chronological order of reception.

Naturally, it is possible to envisage implementing other methods of initializing random or empirical priorities (for example the methods based on a theoretical reception graph or on a measured reception graph).

Then, in a step 208, the next element of the distribution matrix is selected (in scanning the distribution matrix from left to right, i.e. by increments of j, and from top to bottom, i.e. by increments of i).

In the event of negative verification at the step 202 (the block RDB(i, j) does not have to be decoded), the value of the field Rx of the selected element takes the value 0 (i.e. Rx='0') during a step 207 (step of marking of the RDB blocks to be decoded). The algorithm then arrives at the above-described step 208.

In a step 209, a check is made to see if there are remaining elements to be analyzed in the distribution matrix.

In the event of positive verification at the step 209, the steps 202 to 208 repeated for the next element selected during the previous step 208.

In the event of negative verification at the step 209, the algorithm ends at a step 210.

As illustrated in FIG. 6A, at the end of the initializing phase (steps 200 to 209 of FIG. 7), for the synchronous communications module SCM#6, we obtain the elements of the distribution matrix representing RDB blocks associated with the VC chunk container of the following virtual channel VC30:

RDB(1; 6)={VCB=6; VC=30; Rx=1; SDTC=0; retransmitted=0; rank=4; prio=2};
RDB(3; 6)={VCB=6; VC=30; Rx=1; SDTC=0; retransmitted=1; rank=3; prio=1};
RDB(4; 6)={VCB=6; VC=30; Rx=1; SDTC=1; retransmitted=1; rank=2; prio=1};
RDB(5; 18)={VCB=6; VC=30; Rx=1; SDTC=1; retransmitted=1; rank=1; prio=2};
RDB(6; 18)={VCB=6; VC=30; Rx=1; SDTC=1; retransmitted=1; rank=0; prio=1}.

Furthermore, as illustrated in FIG. 6A, at the end of the initialization phase, we obtain, for the synchronous communications module SCM#6, the following elements of the distribution matrix representing RDB blocks associated with the VC chunk container VC52:

RDB(4; 24)={VCB=INDEFINI; VC=52; Rx=1; SDTC=0; retransmitted=0; rank=4; prio=1};
RDB(4 ; 25)={VCB=INDEFINI ; VC=52; Rx=1; SDTC=1; retransmitted=1; rank=2; prio=1};
RDB(6 ; 27)={VCB=INDEFINI ; VC=52; Rx=1; SDTC=1; retransmitted=1; rank=1; prio=1};
RDB(8 ; 27)={VCB=INDEFINI ; VC=52; Rx=1; SDTC=1; retransmitted=1; rank=0; prio=2};
RDB(9 ; 28)={VCB=INDEFINI ; VC=52; Rx=1; SDTC=0; retransmitted=1; rank=3; prio=2}.

Figure 8:
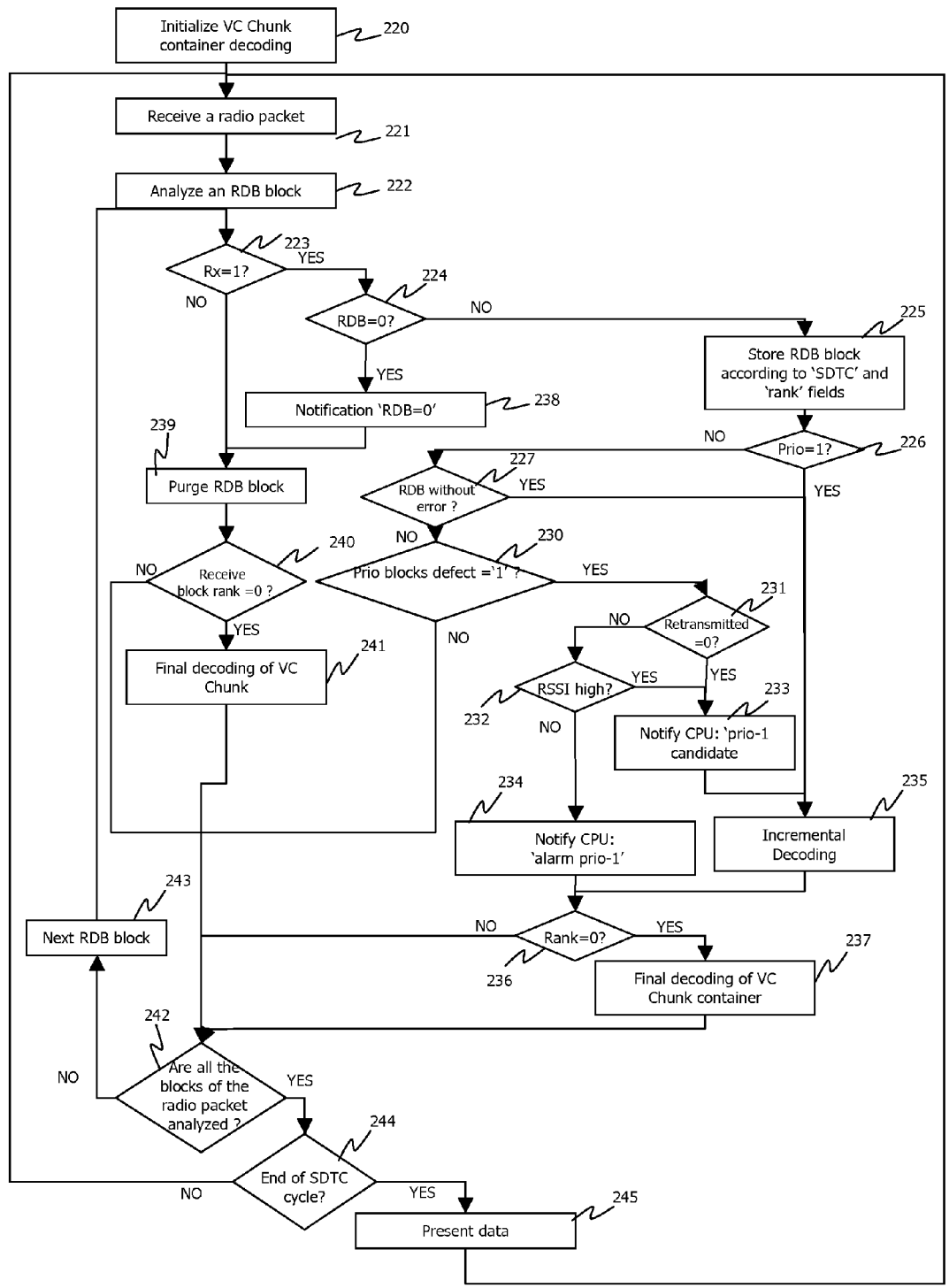
FIG. 8 shows the main steps of an algorithm for decoding a data block implemented by the decoding module of a synchronous communications module during the reception of radio packets according to the particular embodiment of the invention.

Referring now to FIG. 8, we present the main steps of an algorithm for decoding a given VC chunk container with which there are associated several data blocks implemented by the decoding module 66 of a synchronous communications module during the reception of a radio packet according to the particular embodiment of the invention.

In a step 220 (initialization step), the three buffer memories or buffers corresponding to the decoding buffer memories b_SDTC(N) 68 and b_SDTC(N−1) 69, and to the processing buffer memory b_SDTC(N−2) 67 are reserved.

In a step 221, the decoding module 66 receives a radio packet comprising 28 RDB blocks.

In a step 222, the decoding module 66 analyses an RDB block of the received radio packet (starting with the first RDB block of the radio packet).

In a step 223, a check is made to see whether the received RDB block is associated with a VC chunk container intended for the synchronous communications module SCM (i.e. for which Rx=1).

In the event of positive verification at the step 223, a check is made in a step 224 to find out if the RDB block contains a piece of payload information to be decoded, i.e. whether it is not a padding block. This aspect of the invention is described more amply with reference to FIG. 11.

In the event of negative verification at the step 223, and in the event of positive verification (the block is a padding block) at the step 224, the RDB block is eliminated during a step 239 (purging step).

Following the step 239, in a step 240 it is determined whether an RDB block corresponding to the given VC chunk container, and for which the 'rank' field is equal to '0', has been received.

The verification of the step 240 enables the decoding module 66 to work despite the absence of reception of a radio packet, especially in the case of an unforeseeable variation in conditions of transmission (for example a temporary or permanent shadowed).

In the event of negative verification at the step 240 (no RDB block for which the 'rank' field is equal to '0' has been received) the step 242 described here below is applied.

In the event of positive verification at the step 240 (an RDB block whose 'rank' field is equal to '0' has been received), then during a step 241, an algorithm is performed for the final decoding of the VC chunk container for which the RDB block whose 'rank' field is equal to '0' has been received, as described here below with reference to FIG. 10.

In the event of negative verification at the step 224 (the RDB block is not a padding block), the RDB block to be decoded is stored, in a step 225, in one of the decoding buffer memories corresponding either to the buffer memory 68 b_SDTC(N) or to the buffer memory 69 b_SDTC(N−1) depending on the value of its 'STDC' field. Furthermore, the storage also takes account of the value of the ' rank' field of the RDB block.

In a step 226, a check is made to see whether the decoding priority of the RDB block to be decoded is high, i.e. whether the 'prio' field is equal to '1' (indicating that it is used during the implementation of the incremental decoding algorithm described here below with reference to FIG. 9).

In the event of negative verification at the step 226 (the 'prio' field is not equal to '1') a check is made, in a step 227, to see whether the RDB block to be decoded has been received without error in analyzing the associated RDB-FEC field 53, in verifying that the syndrome of the RDB block is equal to zero, it being known that, according to the prior art, the syndrome corresponds to the product of the code word by the transpose of the parity matrix of the error correction code used (for example of the Read-Solomon type).

In the event of positive verification at the step 227 (the RDB block to be decoded has been received without error), an incremental decoding algorithm is executed during the step 235 as described here below with reference to FIG. 9.

In the event of negative verification at the step 227 (the RDB block to be decoded has been received with errors), a check is made in a step 230 to see if no high-priority RDB block (the field 'prio' is equal to '1') has been received.

In the event of negative verification at the step 230 (a high-priority RDB block has been received), the step 242 described further below is implemented.

In the event of positive verification at the step 230 (defect of high-priority RDB block prio='1'), a check is made, at the step 231, to see whether the RDB block to be decoded has come from a first transmission (also called a direct transmission) i.e. that the retransmitted field is equal to '0'.

In the event of positive verification at the step 231 (retransmitted='0'), a notification is made, during the step 233, to the CPU 87, by means of a' candidate prio-1' for a subsequent possible reallocation, by the CPU 87, of the priority levels associated with the RDB blocks in order to optimize the first determining of erasures, in optimizing the selection of the RDB blocks used for the first determining of erasures.

In the event of negative verification at the step 231 (the RDB block to be decoded has not come from a first transmission) a check is made in a step 232 to find out whether the RDB block to be decoded benefits from good conditions of reception (high RSSI or Received Signal Strength Indicator).

In the event of positive verification at the step 232 (high RSSI), the step 233 is applied again.

In the event of negative verification at the step 232 (low RSSI), in the step 234, the CPU 87 is notified, by means of an "alarm prio-1" message, about a possible subsequent reallocation, by the CPU 87, of the priority levels associated with the RDB blocks with the aim of optimizing the first determining of erasures, in optimizing the selection of the RDB blocks used for the first determining of erasures.

Following the steps 234 and 235, a check is made in a step 236 to see whether the "rank" field of the RDB block to be decoded is equal to '0' (last reception of an RDB block representing the VC chunk container).

In the event of positive verification of the step 236 (the rank field of the RDB block to be decoded is equal to '0'), an algorithm is executed for the final decoding of VC chunk during a step 237, as described here below with reference to FIG. 10.

Then, in a step 242, a check is made to see whether all the RDB blocks of the received radio packet have been analyzed.

In the event of negative verification at the step 236 (this is not the last transmission of an RDB block representing the VC chunk container) the verification of the step 242 is implemented.

The verifications of the steps 236 and 240 enable detection of the reception or non-reception of the last RDB block representing de VC chunk container.

In the event of positive verification at the step 242 (all the RDB blocks of the radio packet have been analyzed) a check is made, in a step 244, to find out if the SDTC(N) (current cycle) is over.

In the event of negative verification at the step 242 (not all the RDB blocks of the radio packet have been analyzed) a selection is made, in a step 243, for the next RDB block of the received radio packet. The above-described steps 232 to 242 are then repeated.

In the event of negative verification at the step 244 (the SDTC(N) is not completed), the above-described operations 221 to 242 are repeated.

In the event of positive verification at the step 244 (the SDTC(N) is completed), in the course of the step 245, a permutation is made of the data of the three buffer memories b_SDTC(N) 68, b_SDTC(N−1) 69 and b_SDTC(N−2) 67, in overwriting the data of the buffer memory b_SDTC(N−2). The permutation of the three buffer memories is done as follows:

the new buffer memory 68 b_SDTC(N) uses the resources of the preceding buffer memory b_SDTC(N−2), after resetting of the value of each of the variables. We thus have b_SDTC(N)=b_SDTC(N−2)=0;

the preceding buffer memory b_SDTC(N) 68 becomes the new buffer memory b_SDTC(N−1). We thus have b_SDTC(N−1)=b_SDTC(N);

the preceding buffer memory b_SDTC(N−1) becomes the new buffer memory_SDTC(N−2). We thus have b_SDTC(N−2)=b_SDTC(N−1).

When the step 245 is completed, the operations for processing the preliminarily decoded VC Chunk containers 88 (stored in the buffer memory b_SDTC(N−2) 67) can be implemented and the algorithm returns to the step 221.

Referring to FIG. 8, the decoding algorithm describes the operations implemented by the decoding module 66 of the synchronous communications module to perform the correction of errors of the different VC Chunk containers of the virtual channels intended for it.

Furthermore, the decoding algorithm describes the RDB block selection mechanism 66 through the different steps 223, 224, 226, 231 and 232 at the reception of a radio packet (step 221).

Furthermore, the decoding algorithm more principally describes the relationship of the selection operations with the first-level decoding operation called incremental decoding (described in detail here below with reference to FIG. 9) of the step 235 and the second-level decoding operation called final decoding (described in detail here below with reference to FIG. 10) of the steps 237 and 241.

The decoding algorithm also describes the generation of alarms (steps 233, 234 and 238) as a function of the selection operations, for example in notifying the CPU 87 and in bringing about the generation of an interruption with the interface module CPU 93. The different alarms enable especially the CPU 87 to monitor the proper running of the decoding operations so as to activate, for example, a change in the synchronous bandwidth distribution matrix.

The decoding algorithm of FIG. 8 finally describes the management of the decoding buffer memories b_SDTC(N), b_SDTC(N−1) and b_SDTC(N−2) (steps 220, 244 and 245) at the passage to the next synchronous data transmission cycle.

Thus, the decoding algorithm of FIG. 8 describes the way in which the decoding is done by the decoding module 66 so that the data is always available for presentation to a consumer application at the end of an SDTC cycle.

Figure 9:
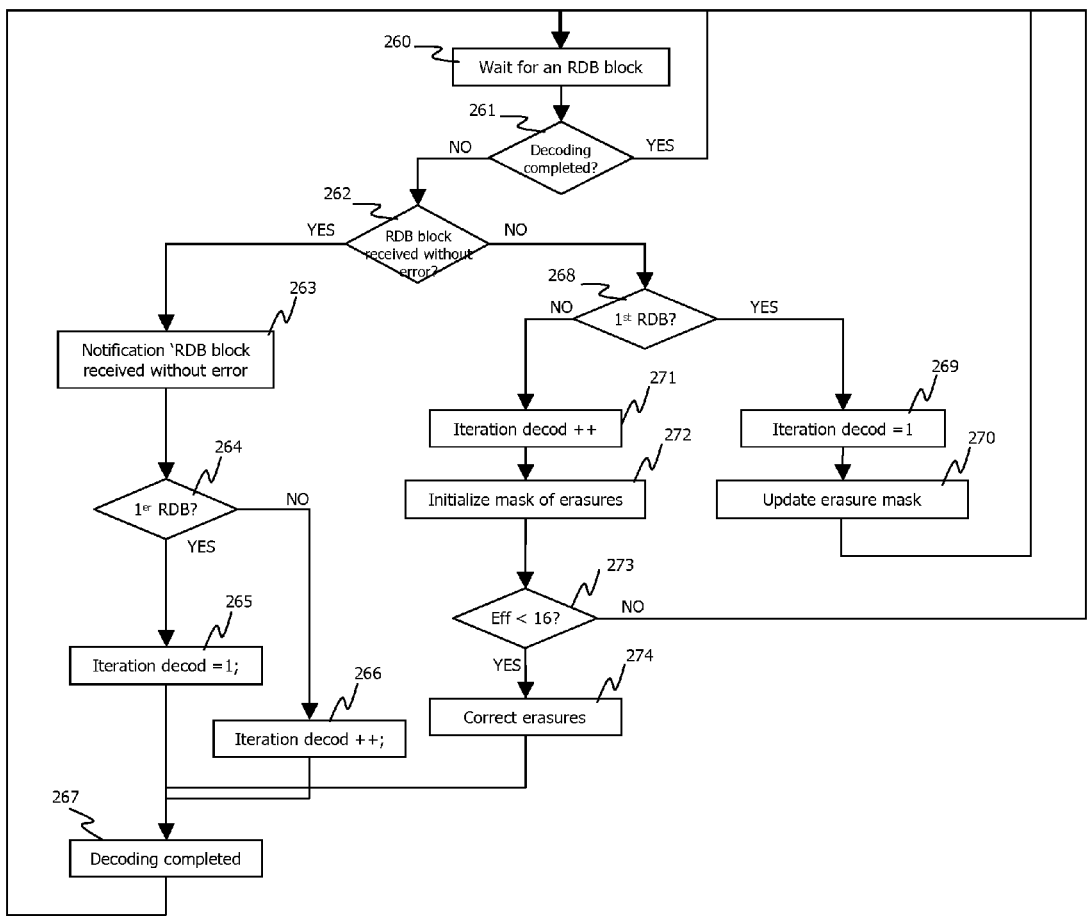
FIG. 9 illustrates the main steps of the incremental (first-level) decoding algorithm implemented by the decoding module of a synchronous communications module according to the particular embodiment of the invention.

Referring to FIG. 9, a description is provided of the main steps of the incremental decoding algorithm (or first-level decoding algorithm) implemented by the decoding module 66 of a synchronous communications module according to the particular embodiment of the invention.

In a step 260, the decoding module 66 waits for an RDB block corresponding to a VC chunk container to be decoded. When it receives an RDB block, the decoding module 66 loads the decoding context associated with the received RDB block.

The decoding context associated with the received RDB block comprises:

an erasure shadow;
the number of decoding iterations:
the state of completion of the decoding;
the corrected value of the RDB block should the decoding be completed;
the set of RDB blocks received previously and representing this same RDB block to be corrected, and for each of these RDB blocks;

The value of the RDB block as received;
The priority of this block, extracted from the reception table;
a marker for taking account of this block in the positioning of the erasure.

In a step 261, a check is made to see whether the decoding of the VC chunk container corresponding to the received RDB block has already been done (decoding completed).

In the event of positive verification at the step 261 (decoding completed), the operation returns to the step 260 (waiting for a next RDB block to be processed).

In the event of negative verification at the step 261 (the decoding of the VC chunk container corresponding to the data bloc received has not yet been completed) in a step 262, the syndrome of the RDB block received is computed to verify that it has been received without error.

Then, in a step 264, a check is made to see whether the RDB block received is the first RDB block received associated with the VC chunk container to be decoded.

In the event of positive verification at the step 264 (first RDB block received), in a step 265, an updating is made of the number of decoding iterations with Decoding iteration='1'.

In the event of negative verification at the step 264 (the received RDB block is not the first), the number of decoding iterations (step referenced Decoding iteration ++) is implemented in a step 266.

Following the steps of updating the number of decoding iterations (steps 265 and 266), a recording is made, in a step 267, of the corrected value of the RDB block with the received RDB block. This marks the completion of the decoding algorithm. Indeed, when an error correction code is used with a parity matrix ensuring that the M first bits of an encoded word are identical with the M first bits of the word to be encoded, the error-free reception of the RDB block makes it possible to obtain all the symbols extracted from the content without having recourse to a step of correction by erasures nor to a decoding step proper.

The algorithm then returns to the step 260 pending the next RDB block to be processed.

In the event of a negative verification at the step 262 (RDB block received with errors) a check is made in a step 268 to find out whether the number of decoding iterations associated with the received RDB block is zero (which corresponds to checking whether the RDB block received is the first RDB block received associated with the VC chunk container to be decoded).

In the event of positive verification at the step 268 (first RDB block received), the number of decoding iterations takes the value 1 (step referenced Decoding iteration=1) during a step 269.

Then, in a step 270, the erasure mask is set at 0 (all the symbols of the RDB block received are considered to be erased) and the RDB block is marked as having been taken into account in the determining of the erasures.

The algorithm then returns to the step 260 pending the next RDB block to be processed.

In the event of negative verification at the step 268 (the RDB block is not the first block), in a step 271, the number of decoding iterations is incremented (Decoding iteration ++).

Then, in a step 272, the erasure mask is updated. This updating consists in comparing the RDB block received with the RDB blocks that have already been taken into account in the determining of the erasures. More specifically, at the positions corresponding to erasures, a 2×2 comparison is made of the symbols of the new RDB block received with the symbols of the preceding blocks and, the erasure is replaced by the value of the symbol when at least two symbols are equal, and this is done for every case of comparison. Thus, the number of erasures is reduced all the more swiftly as the differences between the RDB blocks are small.

Following the step 272, a check is made in a step 273 to find out if the number of erasures (again referenced <<Eff>> has fallen below the maximum correction threshold of the Reed Solomon code applied to the RDB clock (in the particular exemplary embodiment of the invention, this threshold is equal to 16).

In the event of positive verification at the step 270 (i.e. Eff<16), in a step 274, a decoding is done of the erasures according to classic methods, for example those applied to the Reed-Solomon type code, then the step 267 is repeated before returning to wait for the next block to be processed (step 260).

The step of decoding erasures of a Reed-Solomon type code also known as error-erasure decoding of Reed Solomon codes can be done by any conventional methods such as for example the one whose implementation is extensively described in the U.S. Pat. No. 5,715,262.

In the event of negative verification at the step 273 (i.e. Eff>16), the operation returns to a step of waiting for the next block to be processed (step 260).

Referring to FIG. 10, a description is provided of the main steps of the final decoding algorithm (or second-level decoding algorithm) implemented by the decoding module 66 of a synchronous communications module according to the particular embodiment of the invention.

In a step 300, the decoding module 66 waits for an RDB block corresponding to a VC chunk container to be decoded. When it receives an RDB block, the decoding module 66 loads the decoding context associated with the received RDB block.

The decoding context associated with the received RDB block comprises:
 an erasure mask;
 the number of decoding iterations:
 the state of completion of the decoding;
 the corrected value of the RDB block should the decoding be completed;
 the set of RDB blocks received previously and representing this same RDB block to be corrected, and for each of these RDB blocks:
   the value of the RDB block as received;
   the priority of this block, extracted from the reception table;
   a marker for taking account of this block in the positioning of the erasures.

In a step 301, a check is made to see whether the decoding of the VC chunk container corresponding to the received RDB block has already been done (decoding completed).

In the event of positive verification at the step 301 (decoding completed), the operation returns to the step 300 (waiting for a next RDB block to be processed).

In the event of negative verification at the step 301 (the decoding of the VC chunk container corresponding to the data bloc received has not yet been completed) in a step 302, an as yet unprocessed priority level (referenced X) is selected. Advantageously, the selection is made by rising order of priority.

Then, in a step 303, a check is made to see whether there remains an RDB block to be processed corresponding to the selected priority X (for example if there is a first block RDB to be processed for the selected priority X if no RDB block for the selected priority has been processed).

Should then remain no RDB block to be processed corresponding to the selected priority X then, in a step 310, the following priority (step referenced "next prio X++") is selected.

Then in a step 311, a check is made to see if all the priority levels have been processed.

In the event of negative verification at the step 311 (not all the priority levels have been processed), the operation returns to the above-described step 303.

In the event of positive verification at the step 311, then, in a step 312, the header field of the RDB block is updated in order to identify possible erroneous samples (in this case the term "incomplete error correction" is used).

In the particular case where the header field is itself erroneous, an attempt is made to rebuild it by analysis of the payload data field of the RDB block.

Then, in a step 309, a piece of information representing the completion of the decoding is recorded.

Should there remain at least one RDB block to be processed corresponding to the selected priority X a check is made, in a step 314, to see whether the SDTC(N) cycle is completed while the VC Chunk container being decoded is associated with the le STDC(N−1) cycle (i.e. stored in the decoding buffer memory b_SDTC(N−1) 69).

In the event of positive verification at the step 314 (end of the SDTC(N) cycle), the decoding is interrupted and the operation passes directly to the step 312 described here above.

In the event of negative verification of the step 314 (the SDTC(N) cycle is not completed) then, in a step 304, the erasure mask is updated in comparing the stored RDB block with the RDB blocks that have already been taken into account in determining the erasures, especially those of the first determining of erasures, corresponding to the incremental decoding. The symbols of two RDB blocks corresponding to erased positions are compared two by two and then the erasure is replaced by the value of the symbol when the two symbols are equal. This operation is done for all the cases of comparison. Thus, the number of erasures is reduced but is done a priori more randomly than in the step of 72 as illustrated in FIG. 9.

Following the step 304, a check is made in a step 305 to find out if the number of erasures (also noted <<Eff>>) has fallen below the maximum correction threshold of the Reed Solomon code applied to the RDB block (in the example of the particular embodiment of the invention, this threshold is equal to 16).

In the event of a negative verification at the step 305 (i.e. Eff>16), then in a step 306, the next RDB block to be processed is loaded and then the operation returns to the above-described step 303.

In the event of positive verification at the step (i.e. Eff<16), in a step 307, a decoding is done of the erasures for example by means of the above-mentioned classical method (with reference to the step 274) the step 309 is repeated before returning to the phase of waiting for the next block to be processed (step 300).

Referring to FIG. 11, we present the main steps of an algorithm for the detection of padding RDB blocks (also called zero RDB blocks) according to the particular embodiment of the invention.

The detection algorithm is not indispensable to the implementation of the invention but improves the performance of the decoding algorithms of the first (incremental) and second (final) level in eliminating unnecessary processing during the operations for updating the erasure masks (step 272 FIG. 9 and step 304 FIG. 10).

As described here above with reference to FIG. 2, an RDB block comprises especially a 16-bit RDB-H field 51 and an RDB-P field 52 comprising 16 words (also called samples) of 48 bits representing 16 consecutive samples of a virtual channel (the RDB-P field 352 is also called a VC chunk container).

Each bit of the RDB-H field 51 has a corresponding 48-bit word in the RDB-P field 52, in the order of the reading of these fields, from left to right, as illustrated in FIG. 2.

When the retransmission block 91 of the RDB radio data blocks of a synchronous communications module has not received the RDB bloc to be retransmitted, then in its place it inserts an RDB block having a particular sequence, for which the set of bits of the RDB-H field 51 is positioned at '0' and the set of words of the RDB-P field 52 is positioned at the hexadecimal value '0x555555555555' (corresponding to an alternating sequence of '0' and '1' in binary notation).

Thus, the verification at the step 224 illustrated by the flow chart of FIG. 11 is aimed at detecting the above-mentioned particular sequence according to a threshold mechanism to identify the RDB blocks that do not represent preload information and called padding blocks or "zero" blocks In a step 320, the first 48-bit word of a BT chunk container is loaded.

Starting with the first 48-bit word, a check is made in a step 331 to see whether the bit of the corresponding RDB-H field 51 is equal to '0'.

In the event of positive verification at the step 331, a check is made in a step 332 to find out if the value of the 48-bit word considered is equal to the hexadecimal value '0x555555555555'.

In the event of positive verification at the step 332 (the value of the 48-bit word considered is equal to the hexadecimal value '0x555555555555'), then, in a step 333, a counter referenced "cnt" is incremented (the increment is referenced cnt ++).

In the event of negative verification at the step 232 (the value of the 48-bit word considered is not equal to the hexadecimal value '0x555555555555'), the operation passes to the next 48-bit word (step 234) until it has processed all the 48-bit words corresponding to the VC chunk container.

Then, in a step 335, a check is made to see whether the 48-bit word loaded is the last word of the VC chunk container.

If there is a negative verification of the step 335 (the selected word is not the last word), the steps 331 to 335 are repeated.

In the event of positive verification at the step 335 (the selected word is the last word) a check is made in a step 336 to find out if the counter <<cnt>> is above the value of a predetermined threshold (the threshold is for example set at a predefined value of 50% of detection, i.e. the value of the threshold is equal to 8).

In the event of negative verification at the step 336 (cnt<threshold), it is decided, in a step 337, that the RDB block representing the VC chunk container is (RDB≠0) thus terminating the detection algorithm.

In the event of positive verification at the step 336 (cnt>threshold), it is decided in a step 338 that the RDB block representing the VC chunk container is zero (RDB=zero) and this terminates the detection algorithm.

What is claimed is:

1. A method of decoding a data block received by a receiver node in a communication network comprising a plurality of nodes wherein a sender node broadcasts data to a plurality of nodes in the network and the receiver node receives same data directly from the sender node and via at least one node other than the sender node, the data block being encoded using an error correction code which can correct an erasure, wherein the method comprises:

an obtaining step of obtaining a data block directly received from the sender node and at least one corresponding data block received via a node other than the sender node;

a determining step of determining an erasure symbol in the data block directly received from the sender node;

a replacing step of replacing the erasure symbol by a value of a corresponding symbol corresponding to the erasure symbol in the corresponding data block if the corresponding symbol is not an erasure symbol; and a correction step of correcting the erasure symbol, which could not be replaced in the replacing step, using the error correction code.

2. The method according to claim 1, wherein a plurality of corresponding data blocks are obtained in the obtaining step; and the erasure symbol is replaced by the value of the corresponding symbol in the replacing step if the value is common to at least two corresponding symbols.

3. A non-transitory computer readable storage medium storing a program comprising a program code for implementing a method of decoding a data block received by a receiver node in a communication network comprising a plurality of nodes wherein a sender node broadcasts data to a plurality of nodes in the network and the receiver node receives same data directly from the sender node and via at least one node other than the sender node, the data block being encoded using an error correction code which can correct an erasure, wherein the method comprises:

an obtaining step of obtaining a data block directly received from the sender node and at least one corresponding data block received via a node other than the sender node;

a determining step of determining an erasure symbol in the data block directly received from the sender node;

a replacing step of replacing the erasure symbol by a value of a corresponding symbol corresponding to the erasure symbol in the corresponding data block if the corresponding symbol is not an erasure symbol; and a correction step of correcting the erasure symbol, which could not be replaced in the replacing step, using the error correction code.

4. A node for decoding a data block received from a sender node in a communication network comprising a plurality of nodes wherein the sender node broadcasts data to a plurality of nodes in the network and each node receives same data directly from the sender node and via at least one node other than the sender node, the data block being encoded using an error correction code which can correct an erasure, wherein the node comprises:

an obtaining unit adapted to obtain a data block directly received from the sender node and at least one corresponding data block received via a node other than the sender node;

a determining unit adapted to determine an erasure symbol in the data block directly received from the sender node;

a determining unit adapted to replace the erasure symbol by a value of a corresponding symbol corresponding to the erasure symbol in the corresponding data block if the corresponding symbol is not an erasure symbol; and a correction unit adapted to correct the erasure symbol, which could not be replaced in the replacing step, using the error correction node.

* * * * *